US012772444B2

(12) United States Patent
Wu et al.

(10) Patent No.: US 12,772,444 B2
(45) Date of Patent: Oct. 20, 2026

(54) ONE-TIME-PROGRAMMABLE MEMORY DEVICES

(71) Applicant: Taiwan Semiconductor Manufacturing Company, Ltd., Hsinchu (TW)

(72) Inventors: Shao-Ting Wu, Hsinchu (TW); Meng-Sheng Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 229 days.

(21) Appl. No.: 18/518,809

(22) Filed: Nov. 24, 2023

(65) Prior Publication Data

US 2025/0071986 A1 Feb. 27, 2025

Related U.S. Application Data

(60) Provisional application No. 63/578,204, filed on Aug. 23, 2023.

(51) Int. Cl.
*G11C 17/16* (2006.01)
*H10B 20/25* (2023.01)

(52) U.S. Cl.
CPC ............. *H10B 20/25* (2023.02); *G11C 17/16* (2013.01)

(58) Field of Classification Search
CPC ................................ H10B 20/25; G11C 17/16
USPC ............................................................ 365/96
See application file for complete search history.

(56) References Cited

U.S. PATENT DOCUMENTS

2003/0031074 A1 2/2003 Tran et al.
2005/0105366 A1 5/2005 Pedlow, Jr.
2013/0098424 A1* 4/2013 Tsuda ...................... H10F 19/31 136/244
2016/0078962 A1* 3/2016 Park ....................... G11C 17/16 365/96
2022/0129166 A1* 4/2022 Srivastava ......... G11C 29/4401
2022/0367489 A1* 11/2022 Chang ................. H01L 23/5256

FOREIGN PATENT DOCUMENTS

DE 10 2020 132 547 A1 12/2021
KR 10-2009-0094372 A 9/2009
KR 10-2009-0097466 A 9/2009
TW 202027079 A 7/2020

OTHER PUBLICATIONS

Office Action issued in Korean Appl. No. 10-2024-0109016 dated May 26, 2025.
Office Action issued in German Appl. No. 102024101384.2 dated Mar. 31, 2025.
Office Action issued in connection with Taiwan Appl. No. 113114026 dated Mar. 5, 2025.
Office Action issued in Korean Appl. No. 10-2024-0109016 dated Jan. 13, 2026.

* cited by examiner

*Primary Examiner* — Muna A Techane
(74) *Attorney, Agent, or Firm* — Foley & Lardner LLP

(57) ABSTRACT

A memory device is disclosed. The memory device includes a memory array comprising a plurality of memory cells. At least a first one of the memory cells, by default, permanently presents a first logic state based on a short circuit. At least a second one of the memory cells, by default, permanently presents a second logic state opposite to the first logic state based on an open circuit.

20 Claims, 19 Drawing Sheets

ONE-TIME-PROGRAMMABLE MEMORY DEVICES

CROSS-REFERENCE TO RELATED APPLICATION

This application claims priority to and the benefit of U.S. Provisional Application No. 63/578,204, filed Aug. 23, 2023, entitled "OTP MEMORY ARRAY WITH DEFAULT DATA BITS," which is incorporated herein by reference in its entirety for all purposes.

BACKGROUND

In general, there are two main types of data storage elements. The first type is a volatile memory device, in which information stored in a particular storage element is lost the moment the power is removed from the memory device. The second type is a non-volatile memory device, in which the information is preserved even after the power is removed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
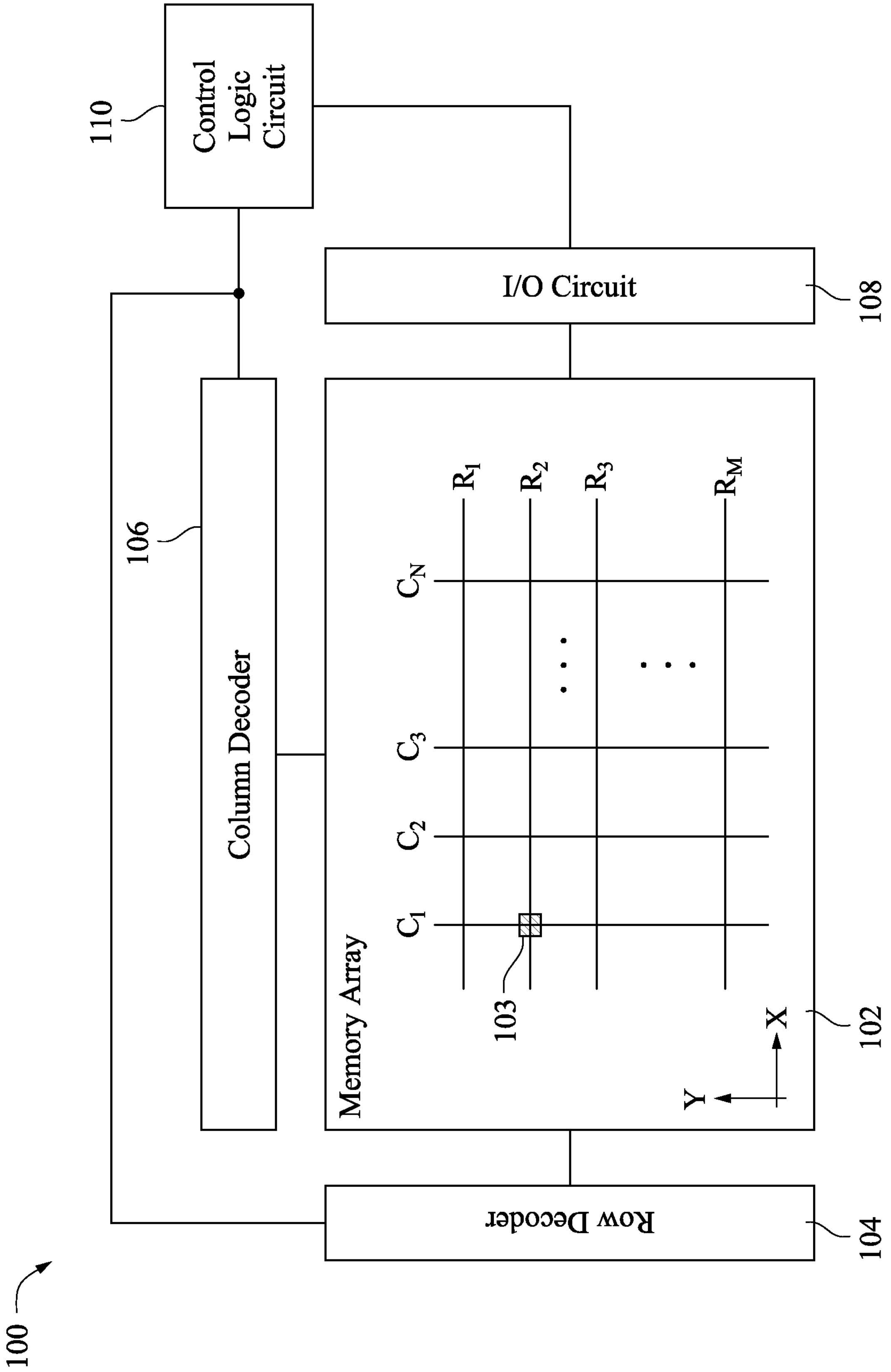
FIG. 1 illustrates a block diagram of an example memory device including a memory array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one of various types of the non-volatile memory device. Example implementations of the OTP memory device include metal fuses, gate oxide fuses, etc. The metal fuse utilizes a metal resistor serving as a programming element of the corresponding OTP memory device. Such a metal fuse is sometimes referred to as an efuse memory device, in which the metal resistor can typically be programmed (e.g., once). The programming process typically involves burning the metal resistor from a short circuit to an open circuit. The gate oxide fuse utilizes a gate oxide (or otherwise gate dielectric material such as, high-k dielectric material) as a programming element of the corresponding OTP memory device. The gate oxide fuse is sometimes referred to as an anti-fuse memory device, in which the gate oxide can typically be programmed (e.g., once). The programming process typically involves breaking down the gate oxide from an open circuit to a short circuit.

The OTP memory device is commonly utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. In yet another example, a recent trend is that a memory array including a plural number of OTP memory cells is utilized for verifying peripheral circuits operatively coupled to or integrated with the memory array. Such a peripheral circuit includes a sense amplifier, which is typically configured to access (e.g., read) the OTP memory cells. In the existing technologies, one or more of the OTP memory cells are preconfigured to present a certain logic state. With the preconfigured logic states at the known positions (i.e., the know OTP memory cells) of the memory array, the peripheral circuit can be verified. To this end, these OTP memory cells are each programmed to the preconfigured logic state through a series of the above-mentioned programming processes.

As the technologies of integrated circuits advance, more circuitry can be implemented in an integrated circuit. Stated another way, various device features of an integrated circuit are generally arranged in a more compact manner. The programming process of an OTP memory device (or cell) is commonly associated with applying a high voltage on or conducting a high current through its programming element. Such a strong (voltage/current) signal utilized during the programming process can inadvertently damage other device features (e.g., the OTP memory cells that are not preconfigured to present any logic state). Moreover, the programming process typically consumes additional power, e.g., given the strong signal applied. Thus, the existing OTP memory devices have not been entirely satisfactory in certain aspects.

The present disclosure provides various embodiments of a one-time-programmable (OTP) memory device that includes a number of memory cells, by default, each presenting a preconfigured logic state without any programming process. In one aspect of the present disclosure, the memory cells, as disclosed herein, may each be an efuse memory cell. The efuse memory cell may operatively be formed as a transistor and a fuse resistor connected to each other in series. In such embodiments, the efuse memory cell that presents logic 1 (hereinafter "default 1 efuse cell") may be formed based on an open circuit, and the default memory cell that present logic 0 (hereinafter "default 0 efuse cell") may be formed on a short circuit. For example, the open circuit can be formed by electrically decoupling various metal tracks of the default 1 efuse cell, and the short circuit can be formed by electrically coupling various metal tracks of the default 0 efuse cell. In another aspect of the present disclosure, the memory cells, as disclosed herein, may each be an anti-fuse memory cell. The anti-fuse memory cell may operatively be formed as a programming transistor and a reading resistor connected to each other in series. In such embodiments, the anti-fuse memory cell that presents logic 1 (hereinafter "default 1 anti-fuse cell") may be formed based on an open circuit, and the default memory cell that present logic 0 (hereinafter "default 0 anti-fuse cell") may be formed on a short circuit. For example, the open circuit can be formed based on utilizing a programming transistor with a relatively high threshold voltage for the default 1 anti-fuse cell, and the short circuit can be formed based on utilizing a programming transistor with a relatively low threshold voltage for the default 0 anti-fuse cell.

FIG. 1 illustrates a block diagram of a memory device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being shown in FIG. 1, all of the components of the memory device 100 may be coupled to each other and to the control logic circuit 110. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit (e.g., 108).

The memory array 102 is a hardware component that stores data. In various embodiments, the memory array 102 is embodied as a semiconductor memory device. The memory array 102 includes a plurality of memory cells (or otherwise storage units) 103. The memory array 102 includes a number of rows $R_1$, $R_2$, $R_3$ . . . $R_M$, each extending in a first direction (e.g., X-direction) and a number of columns $C_1$, $C_2$, $C_3$ . . . $C_N$, each extending in a second direction (e.g., Y-direction). Each of the rows and columns may include one or more conductive (e.g., metal) structures functioning as access lines. Each memory cell 103 is arranged in the intersection of a corresponding row and a corresponding column, and can be operated according to voltages or currents through the respective conductive structures of the column and row. For example, each of the rows may include one or more corresponding word lines (WLs), and each of the columns may include one or more corresponding bit line (BLs).

In some embodiments, each memory cell 103 is embodied as an efuse memory cell that may include a fuse resistor and a WL transistor. The fuse resistor and the WL transistor are coupled to each other in series. Further, a corresponding WL can be connected to a gate terminal of the WL transistor. The fuse resistor can have a first end connected to a corresponding BL and a second end connected to a first source/drain terminal of the WL transistor. A second source/drain terminal of the WL transistor may be coupled to a supply voltage (e.g., ground). Details of the efuse memory cell will be discussed in further detail with respect to FIG. 2.

In some embodiments, each memory cell 103 is embodied as an anti-fuse memory cell that may include a programming transistor and a reading transistor. The programming transistor and the reading transistor are coupled to each other in series. Further, a corresponding programming WL can be connected to a gate terminal of the programming transistors, and a corresponding reading WL can be connected to a gate terminal of the reading transistor. A corresponding BL can be connected to a first source/drain terminal of the reading transistor, with a second source/drain terminal of the reading transistor connected to a first source/drain terminal of the programming transistor. A second source/drain terminal of the programming transistor may be floating. Details of the anti-fuse memory cell will be discussed in further detail with respect to FIG. 3.

The row decoder 104 is a hardware component that can receive a row address of the memory array 102 and assert a conductive structure (e.g., the WL) at that row address. The column decoder 106 is a hardware component that can receive a column address of the memory array 102 and assert a conductive structure (e.g., the BL) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 2:
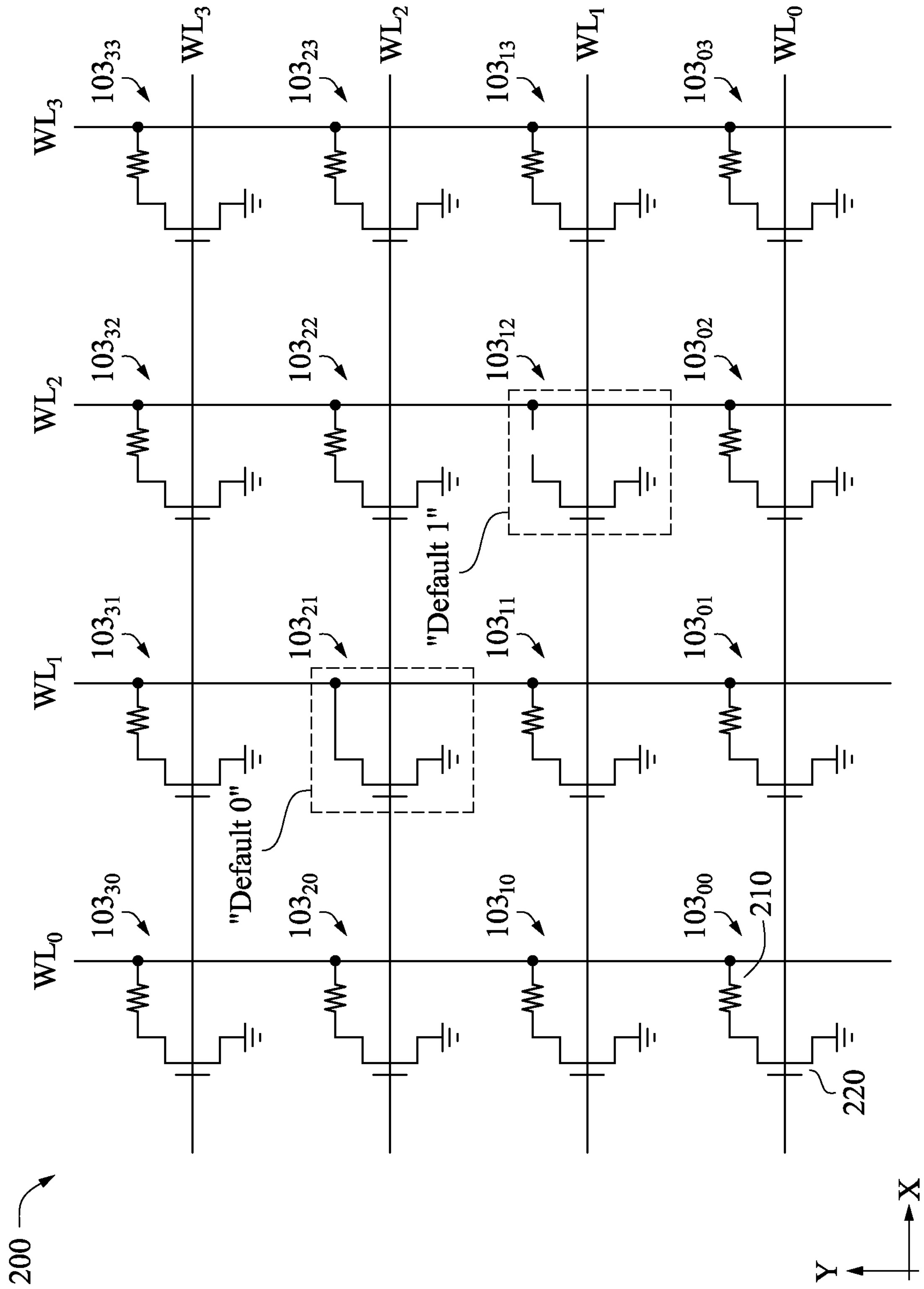
FIG. 2 illustrates a schematic diagram of a portion of the memory array of FIG. 1, in which each of its memory cells is implemented as an efuse memory cell, in accordance with some embodiments.

FIG. 2 illustrates a schematic diagram 200 of a portion of the memory device 100 (e.g., some of the memory cells 103)

in which each of the memory cells 103 is implemented as an efuse memory cell, in accordance with some embodiments. In the illustrated examples of FIG. 2, efuse memory cells $\mathbf{103}_{00}$, $\mathbf{103}_{01}$, $\mathbf{103}_{02}$, $\mathbf{103}_{03}$, $\mathbf{103}_{10}$, $\mathbf{103}_{11}$, $\mathbf{103}_{12}$, $\mathbf{103}_{13}$, $\mathbf{103}_{20}$, $\mathbf{103}_{21}$, $\mathbf{103}_{22}$, $\mathbf{103}_{23}$, $\mathbf{103}_{30}$, $\mathbf{103}_{31}$, $\mathbf{103}_{32}$, and $\mathbf{103}_{33}$ of the memory array 102 are shown, in which the first subscript and the second subscript may represent its corresponding row and column, respectively. Although sixteen efuse memory cells $\mathbf{103}_{00}$ to $\mathbf{103}_{33}$ are shown, it should be appreciated that the memory array 102 can have any number of similar efuse memory cells, while remaining within the scope of present disclosure.

As shown, each of the efuse memory cells $\mathbf{103}_{00}$ to $\mathbf{103}_{33}$ consists of a fuse resistor and a WL transistor connected to each other in series, and is operatively connected to one WL and one BL that are disposed in the corresponding row and corresponding column, respectively. Using the efuse memory cell $\mathbf{103}_{00}$ as a representative example, the efuse memory cell $\mathbf{103}_{00}$ consists of a fuse resistor 210 and a WL transistor 220 connected in series, and is disposed at an intersection of $BL_0$ and $WL_0$ (column $C_0$ and row $R_0$). The fuse resistor 210 has one end connected to the $BL_0$ and the other end connected to a first source/drain terminal of the WL transistor 220. The WL transistor 220 has a second source/drain terminal connected to ground, and a gate terminal connected to the $WL_0$.

In some embodiments, the WL transistor 220 may be formed along the major surface of a substrate (sometimes referred to as part of "front-end-of-line (FEOL) processing/network"). Such a transistor may sometimes be referred to as an FEOL transistor. Over the FEOL network, a number of metallization layers can be formed (sometimes referred to as part of "back-end-of-line (BEOL) processing/network"). The fuse resistor 210 may be formed in or through the BEOL network. For example, the fuse resistor 210 may include a number of metal tracks disposed in one or more corresponding metallization layers. Depending on whether the efuse memory cell is preconfigured as a default 0 efuse cell or default 1 efuse cell, some of the metal tracks are electrically coupled to each other or electrically isolated from each other. As such, these default efuse cells can each permanently present a preconfigured logic state, upon being formed (or fabricated). Stated another way, the default efuse cells, as disclosed herein, cannot be further programmed to present a desired logic state upon being fabricated, and such a logic state cannot be altered.

For example, in FIG. 2, among the efuse memory cells $\mathbf{103}_{00}$ to $\mathbf{103}_{33}$, the efuse memory cells $\mathbf{103}_{21}$ and efuse memory cells $\mathbf{103}_{12}$ are preconfigured as a default 0 efuse cell and a default 1 efuse cell, respectively, while other efuse memory cells remain as virgin efuse cells. The term virgin efuse cell, as used herein, may refer to an efuse memory cell that presents a short circuit (or logic 0), as fabricated, and can be programmed to present an open circuit (or logic 1). Different from the virgin efuse memory cells, the efuse memory cell $\mathbf{103}_{21}$ can present logic 0, as fabricated, and cannot be programmed to logic 1, and the efuse memory cell $\mathbf{103}_{12}$ can present logic 1, as fabricated, and cannot be programmed to logic 0. Respective structures or configurations of the virgin efuse cell, default 0 efuse cell, and default 1 efuse cell will be discussed in further detail with respect to FIGS. 3, 4, and 5, respectively.

Although one default 0 efuse cell and one default 1 efuse cell are shown in the illustrative embodiment of FIG. 2, it should be understood that an array can include any number of default 0 efuse cells and any number of default 1 efuse cells. Further, in some embodiments, respective locations of the default 0 efuse cell(s) and default 1 efuse cell(s) in the array can also be preconfigured. With the locations of these default cells in an array known, respective functionalities of one or more peripheral circuits (e.g., sense amplifiers) operatively coupled to the array can be verified. For example, the logic state of a default cell and where such a default cell is located in an array can be preconfigured (e.g., known). If a sense amplifier operatively coupled to the default cell reads out a logic state inconsistent with the preconfigured logic state, the sense amplifier may be determined as malfunctioning. In another example, given that the logic state and the location of a default cell are both preconfigured and an operatively coupled sense amplifier has been determined as properly functioning, if the sense amplifier still reads out an inconsistent logic state. One or more other peripheral circuits (e.g., a corresponding column decoder and/or a corresponding row decoder) may be determined as malfunctioning.

Figure 3:
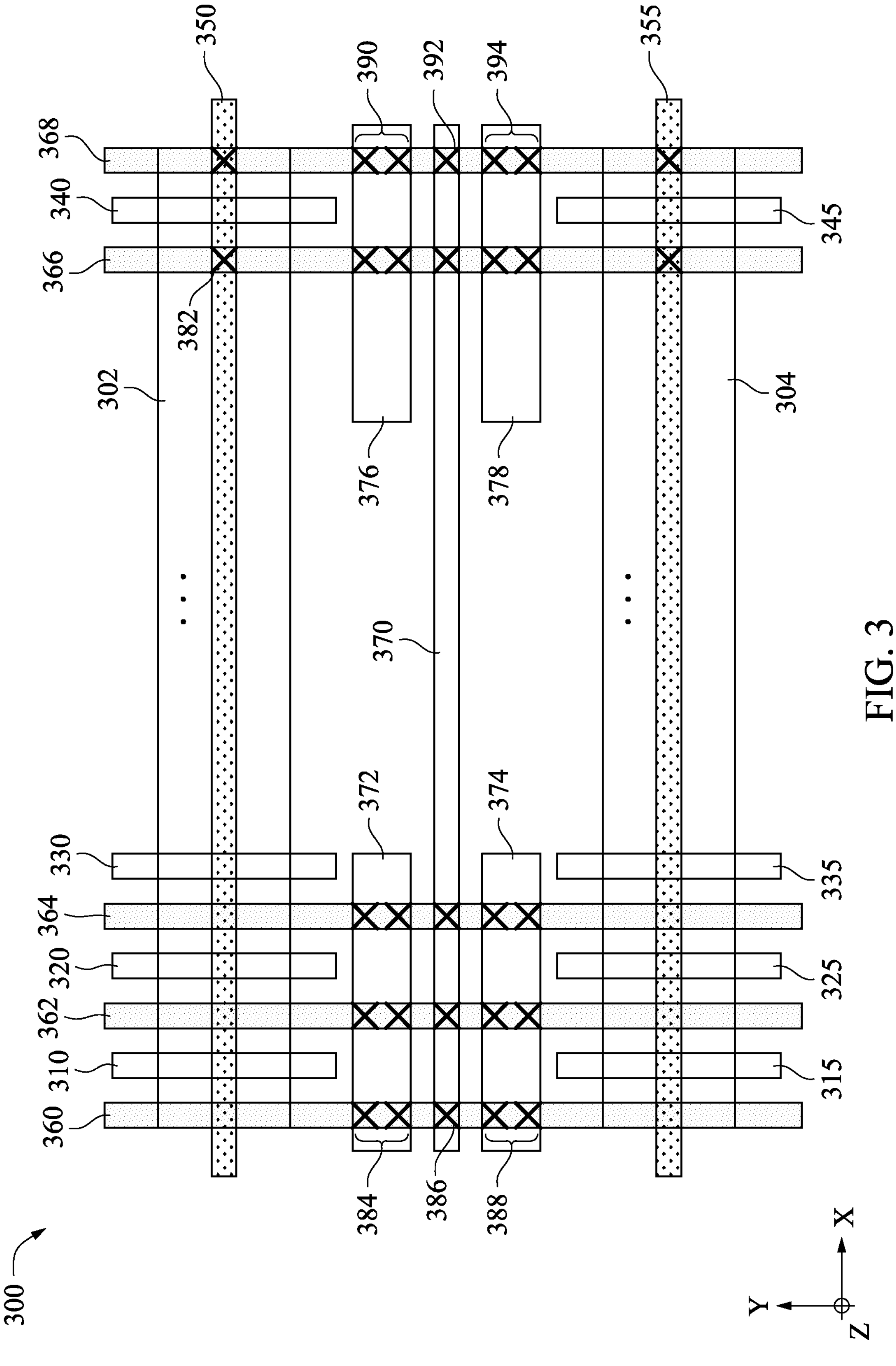
FIG. 3 illustrates an example layout configured to form a virgin efuse cell, in accordance with some embodiments.

Referring first to FIG. 3, an example layout 300 that can be utilized to form the virgin efuse cell (e.g., $\mathbf{103}_{00}$ of FIG. 2) is illustrated, in accordance with various embodiments. As mentioned above, the virgin efuse cell, as disclosed herein, is formed of a WL transistor and a fuse resistor coupled in series, in which the fuse resistor can be programmed to a desired logic state. In some embodiments, the WL transistor can be constructed by a number (e.g., 100) of sub-transistors, which are coupled to one another in parallel; and the fuse resistor can be constructed by at least one metal track disposed above those sub-transistors.

For example, each of the sub-transistors virgin efuse cell $\mathbf{103}_{00}$ can have a channel structure constituted by a number of nanostructures (e.g., nanosheets, nanowires, nanobridges), in accordance with some embodiments of present disclosure. Although the current disclosure is directed to forming the channel structure as a combination of discrete nanostructures, it should be understood that the channel structure of the sub-transistor of the virgin efuse cell $\mathbf{103}_{00}$ can be formed as integral one-piece structure (e.g., a semiconductor fin structure), while remaining within the scope of present disclosure.

As shown in FIG. 3, the layout 300 includes patterns 302 and 304 that are each configured to form an active region (hereinafter "active region 302," and "active region 304," "respectively); and patterns 310, 315, 320, 325, 330, 335, 340, and 345 that are each configured to form a gate structure (hereinafter "gate structure 310," "gate structure 315," "gate structure 320," "gate structure 325," "gate structure 330," "gate structure 335," "gate structure 340," and "gate structure 345," respectively). In some embodiments, the active regions 302 to 304 may each extend along a first lateral direction (e.g., X-direction), while the gate structures 310 to 345 may each extend along a second, different lateral direction (e.g., Y-direction). It should be understood that the layout 300 can include any number of each of the active regions and gate structures, while remaining within the scope of present disclosure.

Further, each of the gate structures 310 to 345 traverses either one of the active region 302 or 304, in the illustrative embodiment of FIG. 3. Stated another way, the gate structure 310 is aligned with but spaced apart from a corresponding gate structure, e.g., the gate structure 315, along the Y-direction; the gate structure 310 is aligned with but spaced apart from a corresponding gate structure, e.g., the gate structure 325, along the Y-direction; and so on. However, it should be understood that each of the gate structures 310 to 345 can continuously extend across both of the active regions 302 and 304, in some other embodiments.

In some embodiments, each of the active regions 302 to 304 is formed of a stack structure protruding from a major surface of a substrate. The stack includes a number of semiconductor nanostructures (e.g., nanosheets) extending along the X-direction and vertically separated from each other. Portions of the semiconductor structures in the stack that are overlaid by the gate structure remain, while other portions are replaced with a number of epitaxial structures. The remaining portions of the semiconductor structures can be configured as the channel of a corresponding transistor (or sub-transistor), the epitaxial structures coupled to both sides (or ends) of the remaining portions of the semiconductor structures can be configured as source/drain structures (or terminals) of the transistor (or sub-transistor), and a portion of the gate structure that overlays (e.g., straddles) the remaining portions of the semiconductor structures can be configured as a gate structures (or terminal) of the transistor (or sub-transistor).

For example in FIG. 3, the portion of the active region 302 that is overlaid by the gate structure 310 may include a number of nanostructures vertically separated from each other, which can function as the channel of a first sub-transistor. The portions of the active region 302 that are disposed on opposite sides of the gate structure 310 are replaced with epitaxial structures. Such epitaxial structures can function as source/drain terminals of the first sub-transistor. The gate structure 310 can function as a gate terminal of the first sub-transistor. Similarly, a second sub-transistor can be formed by the active region 302 and the gate structure 320. Thus, it should be appreciated that the layout 300 can be used to fabricate a certain number of such sub-transistors. In some embodiments, such sub-transistors, formed based on the patterns 302 to 304 and 310 to 345, can be coupled to each other in parallel to collectively function as the WL transistor of the virgin efuse cell $\mathbf{103}_{00}$ (FIG. 2).

The layout 300 further includes patterns 350, 355, 360, 362, 364, 366, 368, 370, 372, 374, 376, and 378 that are each configured to form a metal structure/track (hereinafter "metal track 350," "metal track 355," "metal track 360," "metal track 362," "metal track 364," "metal track 366," "metal track 368," "metal track 370," "metal track 372," "metal track 374," "metal track 376," and "metal track 378," respectively). In some embodiments, these metal tracks 350 to 378 are formed across a plural number of metallization layers disposed over the major surface of the substrate (e.g., along which the WL transistor or its sub-transistors are formed). Such metallization layers are sometimes referred to as M0 layer, M1 layer, M2 layer, etc., where the M0 layer may be the closest one to the major surface of the substrate. Each of the metallization layers includes a number of metal tracks embedded in one or more corresponding inter-layer dielectric (ILD) materials or inter-metal dielectric (IMD) materials.

In comparison with the WL transistor (or its sub-transistors) that are typically referred to as being formed in a front-end-of-line (FEOL) network, the metallization layers are typically referred to as being formed in a back-end-of-line (BEOL) network. Although not shown purely for brevity purposes, the layout 300 can include a number of patterns to form respective middle-end-of-line (MEOL) metal structures. Such MEOL metal structures can electrically couple one or more of the FEOL components (e.g., the gate terminal, the drain terminal, the source terminal) to a corresponding one of the BEOL components (e.g., the metal track in any of the metallization layers). For example, the layout 300 may include patterns to form respective MD structures, each of which can be coupled to a source or drain terminal, patterns to form respective VG structures, each of which can couple a gate terminal to a metal track in M0 layer, and patterns to form respective VD structures, each of which can couple an MD structure to a metal track in M0 layer. Some of such MEOL metal structures are shown in the cross-sectional views of FIGS. 6-7, for illustrative purposes.

Referring still to FIG. 3, in some embodiments, the metal tracks 350 to 355 may be formed in M0 layer and extend along the first lateral direction (e.g., the X-direction); the metal tracks 360 to 368 may be formed in M1 layer and extend along the second lateral direction (e.g., the Y-direction); and the metal tracks 372 to 378 may be formed in M2 layer and extend along the first lateral direction (e.g., the X-direction). Accordingly, the metal tracks 350 to 355 may each sometimes be referred to as an M0 track; the metal tracks 360 to 368 may each sometimes be referred to as an M1 track; and the metal tracks 372 to 378 may each sometimes be referred to as an M2 track.

In some embodiments of the present disclosure, the M2 tracks 370 to 378 can collectively serve as a part of the fuse resistor of the virgin efuse cell $\mathbf{103}_{00}$ (FIG. 2). Specifically, the M2 track 370 has a first (e.g., right) end coupled to one of the source/drain terminal of each of the sub-transistors formed below, and a second (e.g., left) end coupled to a BL, which can be formed as one or more metal tracks across at least one of the metallization layers. Further, on the sides of the right end of the M2 track 370 (along the Y-direction), the M2 tracks 376 and 378 are spaced from the M2 track 370; and on the sides of the left end of the M2 track 370 (along the Y-direction), the M2 tracks 372 and 374 are spaced from the M2 track 370. In some embodiments, the M2 tracks 384 and 388 can also be electrically coupled to the source/drain terminal of each of the sub-transistors formed below, and the M2 tracks 376 and 378 can also be electrically coupled to the BL. Further, in some embodiments, the M2 track 370 may be formed with a narrower width (along the Y-direction) than each of the M2 tracks 372 to 378, but the M2 track 370 may be formed with a longer length (along the X-direction) than each of the M2 tracks 372 to 378.

The layout 300 further includes patterns to form via structures that are each configured to electrically couple a first metal track in a lower metallization layer to a second metal track in an upper metallization layer. For example, each of the M0 tracks 350 and 355 is electrically coupled to a number of sub-transistors formed therebelow, and to a number of M1 tracks formed thereupon through a number of via structures 382, each of which is sometimes referred to as a V0 structure. Similarly, each of the M2 tracks 372 to 378 is electrically coupled to a number of M1 tracks formed therebelow through a number of via structures 384, 386, 388, 390, 392, and 394, etc., each of which is sometimes referred to as a V1 structure.

As such, the right end of the M2 track 370, together with the M2 tracks 376 and 378, can be coupled to the underlying WL transistor through the V1 structures 390-394, the M1 tracks 366-368, the corresponding V0 structures 382, and the M0 tracks 350-355; and the left end of the M2 track 370, together with the M2 tracks 372 and 374, can be coupled to the BL which may be formed in the next upper M3 layer through a number of via structures (not shown), according to some embodiments. In some other embodiments, the BL can be formed in any of various other upper metallization layer, or on a backside of the substrate, while remaining within the scope of the present disclosure. Operatively, a programming voltage can be applied through the BL and to the left end of the M2 track 370 and the M2 tracks 372 and 374. With the underlying WL transistor turned on, the metal track 370 can conduct a current flowing from the left end to the right end, which can burn or blow the metal track 370. After being programmed, a reading voltage can be similarly applied through the BL and to the left end of the M2 track 370 and the M2 tracks 372 and 374. With the underlying WL transistor turned on, the metal track 370 can conduct a current flowing from the left end to the right end. If the metal track 370 has been burned (i.e., an open circuit formed), no such a current can flow through and a programmed logic state of the virgin efuse cell $\mathbf{103}_{00}$ can be determined as logic 1. If the metal track 370 has not been burned (e.g., remaining as a short circuit), such a current can flow through and the programmed logic state of the virgin efuse cell $\mathbf{103}_{00}$ can be determined as logic 0.

In the illustrative embodiment of FIG. 3, the left end of the M2 track 370 is coupled to the M1 tracks 360 to 364 through the V1 structures 384 to 388, but these M1 tracks 360 to 364 may not be coupled to the underlying WL transistor. Stated another way, no V0 structure 382 is formed between the M0 track 350/355 and the M1 track 360/362/364. The right end of the M2 track 370 is coupled to the M1 tracks 366 and 368, and these M1 tracks 366 to 368 may be further coupled to the underlying WL transistor through at least a number of the V0 structures 382 and the M0 tracks 350-355. Further, although three M1 tracks (e.g., 360-364) decoupled from the WL transistor and two M1 tracks (e.g., 366 and 368) coupled to the WL transistor are illustrated in FIG. 3, it should be understood that the layout 300 can include any number of M1 tracks formed on either end of the M2 track 370 (e.g., symmetric numbers) while remaining within the scope of the present disclosure.

Figure 4:
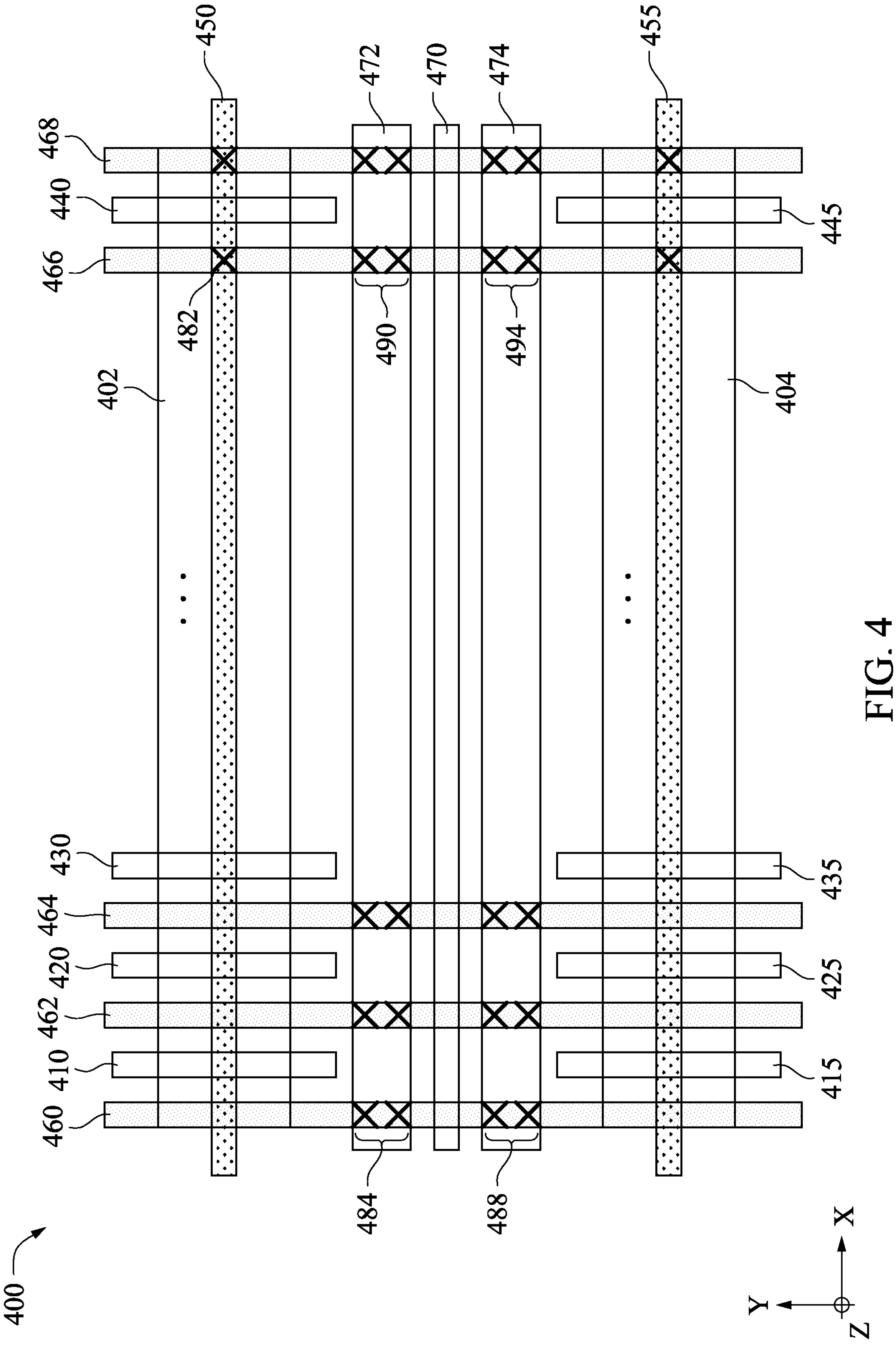
FIG. 4 illustrates an example layout configured to form a default 0 efuse cell, in accordance with some embodiments.

Referring next to FIG. 4, an example layout 400 that can be utilized to form the default 0 efuse cell (e.g., $\mathbf{103}_{21}$ of FIG. 2) is illustrated, in accordance with various embodiments. As mentioned above, the default 0 efuse cell, as disclosed herein, is formed of a WL transistor and a fuse resistor coupled in series, in which the fuse resistor is operatively configured as a short circuit (upon being fabricated), i.e., logic 0, and cannot be programmed to other logic state. In some embodiments, the WL transistor can be constructed by a number (e.g., 100) of sub-transistors, which are coupled to one another in parallel; and the fuse resistor can be constructed by at least one metal track disposed above those sub-transistors.

Similar to the layout 300 of the virgin efuse cell $\mathbf{103}_{00}$, each of the sub-transistors of the default 0 efuse cell $\mathbf{103}_{21}$ can have a channel structure constituted by a number of nanostructures (e.g., nanosheets, nanowires, nanobridges), in accordance with some embodiments of present disclosure. Although the current disclosure is directed to forming the channel structure as a combination of discrete nanostructures, it should be understood that the channel structure of the sub-transistor of the default 0 efuse cell $\mathbf{103}_{21}$ can be formed as integral one-piece structure (e.g., a semiconductor fin structure), while remaining within the scope of present disclosure.

In some embodiments, the layout 400 has its portion configured to form the WL transistor substantially similar to the portion of the layout 300 (e.g., the active regions 302-304 and the gate structures 310-345), and thus, the following description of the layout 400 will be focused on the difference. For example in FIG. 4, the layout 400 includes patterns 402 and 404 that are each configured to form an active region (hereinafter "active region 402," and "active region 404," "respectively); and patterns 410, 415, 420, 425, 430, 435, 440, and 445 that are each configured to form a gate structure (hereinafter "gate structure 410," "gate structure 415," "gate structure 420," "gate structure 425," "gate structure 430," "gate structure 435," "gate structure 440," and "gate structure 445," respectively). The sub-transistors of the WL transistor of the default 0 efuse cell $\mathbf{103}_{21}$ can be formed by the active regions 402 to 404 and the gate structures 410 to 445.

The layout 400 further includes patterns 450, 455, 460, 462, 464, 466, 468, 470, 472, and 474 that are each configured to form a metal structure/track (hereinafter "metal track 450," "metal track 455," "metal track 460," "metal track 462," "metal track 464," "metal track 466," "metal track 468," "metal track 470," "metal track 472," "metal track 474," respectively). In some embodiments, these metal tracks 450 to 478 are formed across a plural number of metallization layers disposed over the major surface of the substrate (e.g., along which the WL transistor or its sub-transistors are formed). Such metallization layers are sometimes referred to as M0 layer, M1 layer, M2 layer, etc., where the M0 layer may be the closest one to the major surface of the substrate. Each of the metallization layers includes a number of metal tracks embedded in one or more corresponding inter-layer dielectric (ILD) materials or inter-metal dielectric (IMD) materials.

In comparison with the WL transistor (or its sub-transistors) that are typically referred to as being formed in a front-end-of-line (FEOL) network, the metallization layers are typically referred to as being formed in a back-end-of-line (BEOL) network. Although not shown purely for brevity purposes, the layout 400 can include a number of patterns to form respective middle-end-of-line (MEOL) metal structures. Such MEOL metal structures can electrically couple one or more of the FEOL components (e.g., the gate terminal, the drain terminal, the source terminal) to a corresponding one of the BEOL components (e.g., the metal track in any of the metallization layers). For example, the layout 400 may include patterns to form respective MD structures, each of which can be coupled to a source or drain terminal, patterns to form respective VG structures, each of which can couple a gate terminal to a metal track in M0 layer, and patterns to form respective VD structures, each of which can couple an MD structure to a metal track in M0 layer. Some of such MEOL metal structures are shown in the cross-sectional views of FIGS. 8-10, for illustrative purposes.

Referring still to FIG. 4, in some embodiments, the metal tracks 450 to 455 may be formed in M0 layer and extend along the first lateral direction (e.g., the X-direction); the metal tracks 460 to 468 may be formed in M1 layer and extend along the second lateral direction (e.g., the Y-direction); and the metal tracks 470 to 474 may be formed in M2 layer and extend along the first lateral direction (e.g., the X-direction). Accordingly, the metal tracks 450 to 455 may each sometimes be referred to as an M0 track; the metal tracks 460 to 468 may each sometimes be referred to as an M1 track; and the metal tracks 470 to 474 may each sometimes be referred to as an M2 track.

In some embodiments of the present disclosure, the M2 tracks 470 to 474 can collectively serve as a part of the fuse resistor of the default 0 efuse cell $\mathbf{103}_{21}$ (FIG. 2). On the sides of the M2 track 470 (along the Y-direction), the M2 tracks 472 and 474 are spaced from the M2 track 470. Each of the M2 tracks 472 and 474 can extend with the same length as the M2 track 470. Different from the layout 300 (the virgin efuse cell $\mathbf{103}_{00}$), the metal track 470 is electrically isolated from the underlying components (e.g., the corresponding WL transistor), in some embodiments. As shown, no via structure is formed between the M2 track 470 and any of the underlying M1 tracks (e.g., 460 to 468).

Instead, the M2 tracks 472 and 474 can each have its first (e.g., right) end electrically coupled to the source/drain terminal of each of the sub-transistors formed below, and the M2 tracks 472 and 474 can each have its second (e.g., left) end electrically coupled to a BL, which can be formed as one or more metal tracks across at least one of the metallization layers. Further, in some embodiments, the M2 track 470 may be formed with a narrower width (along the Y-direction) than each of the M2 tracks 472 and 474.

The layout 400 further includes patterns to form via structures that are each configured to electrically couple a first metal track in a lower metallization layer to a second metal track in an upper metallization layer. For example, each of the M0 tracks 450 and 450 is electrically coupled to a number of sub-transistors formed therebelow, and to a number of M1 tracks formed thereupon through a number of via structures 482, each of which is sometimes referred to as a V0 structure. Similarly, each of the M2 tracks 472 and 474 is electrically coupled to a number of M1 tracks formed therebelow through a number of via structures 484, 488, 490, and 494, etc., each of which is sometimes referred to as a V1 structure.

As such, the right end of the M2 tracks 472 and 474 can be coupled to the underlying WL transistor through the V1 structures 490-494, the M1 tracks 466-468, the corresponding V0 structures 482, and the M0 tracks 450-455; and the left end of M2 tracks 470 to 474 (or just 472 and 474) can be coupled to the BL which may be formed in the next upper M3 layer through a number of via structures (not shown), according to some embodiments. In some other embodiments, the BL can be formed in any of various other upper metallization layer, or on a backside of the substrate, while remaining within the scope of the present disclosure. Operatively, as the M2 tracks 472 and 474 are each formed to couple the BL to the underlying WL transistor, a short circuit is formed between the BL and the WL transistor. The M2 tracks 472 and 474 may sometimes be referred to as short tracks. Further, the width of the M2 track 470 is substantially narrower than the width of each of the M2 tracks 472 and 474. Even though a voltage signal is applied on the BL (which may be coupled to the M2 tracks 470 to 474), the wider M2 tracks 472-474 cannot be programmed, i.e., cannot become from the short circuit to an open circuit. Consequently, the default 0 efuse cell $\mathbf{103}_{21}$ can present logic 0 (a short circuit equivalently across its fuse resistor), as fabricated, and such logic 0 cannot be altered even applied with a programming voltage.

In the illustrative embodiment of FIG. 4, the left end of the M2 track 470 is not coupled to any of the M1 tracks 460 to 464, and these M1 tracks 460 to 464 may not be coupled to the underlying WL transistor. Stated another way, no V0 structure 482 is formed between the M0 track 450/455 and the M1 track 460/462/464. The right end of the M2 track 470 is not coupled to any of the M1 tracks 466 to 468, either, but these M1 tracks 466 to 468 may be coupled to the underlying WL transistor through at least a number of the V0 structures 482 and the M0 tracks 450-455. Further, although three M1 tracks (e.g., 460-464) decoupled from the WL transistor and two M1 tracks (e.g., 466 and 468) coupled to the WL transistor are illustrated in FIG. 4, it should be understood that the layout 400 can include any number of M1 tracks formed on either end of the M2 track 470 (e.g., symmetric numbers) while remaining within the scope of the present disclosure.

Figure 5:
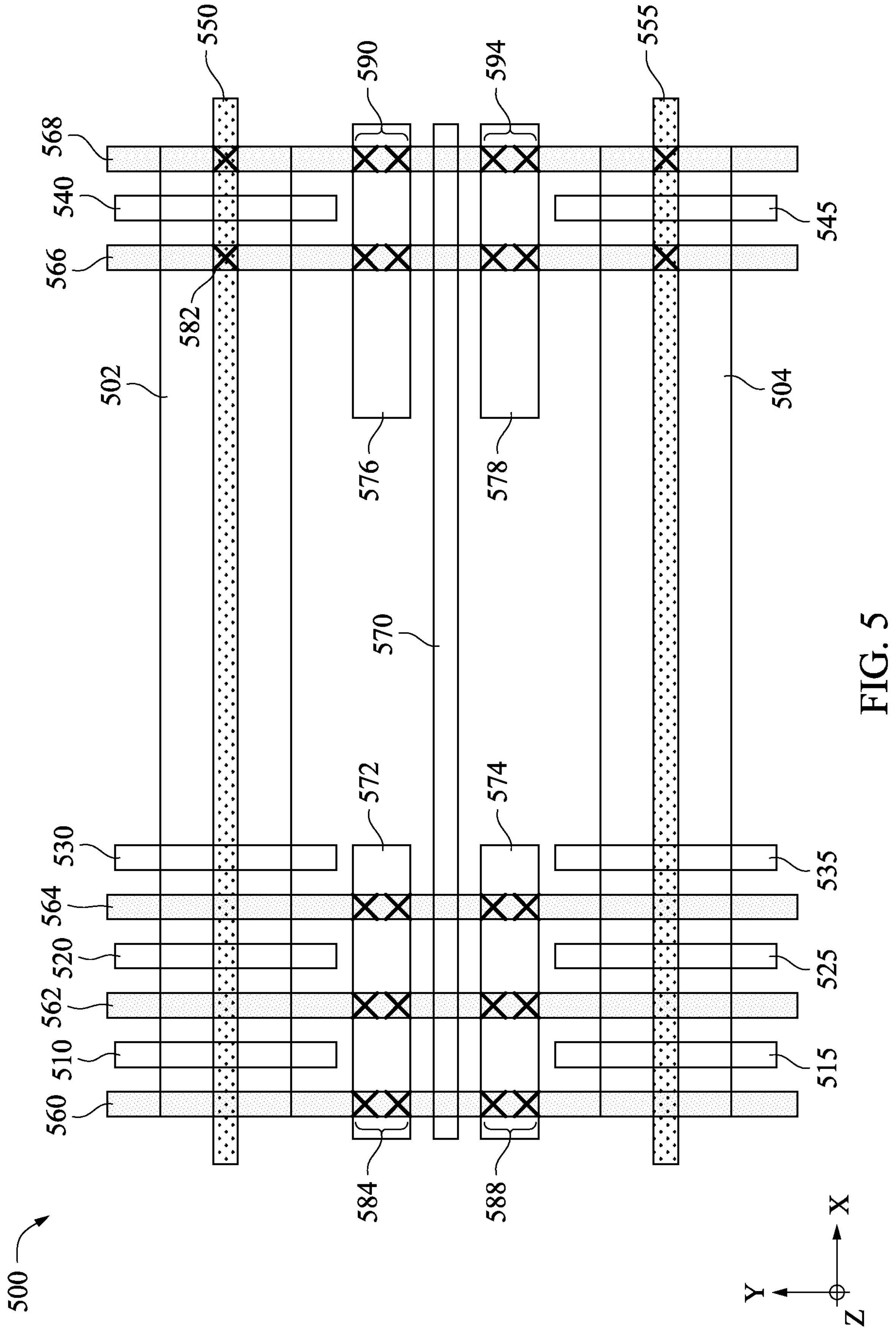
FIG. 5 illustrates an example layout configured to form a default 1 efuse cell, in accordance with some embodiments.

Referring then to FIG. 5, an example layout 500 that can be utilized to form the default 1 efuse cell (e.g., $\mathbf{103}_{12}$ of FIG. 2) is illustrated, in accordance with various embodiments. As mentioned above, the default 1 efuse cell, as disclosed herein, is formed of a WL transistor and a fuse resistor coupled in series, in which the fuse resistor is operatively configured as an open circuit (upon being fabricated), i.e., logic 1, and cannot be programmed to other logic state. In some embodiments, the WL transistor can be constructed by a number (e.g., 100) of sub-transistors, which are coupled to one another in parallel; and the fuse resistor can be constructed by at least one metal track disposed above those sub-transistors.

Similar to the layout 300 of the virgin efuse cell $\mathbf{103}_{00}$, each of the sub-transistors of the default 1 efuse cell $\mathbf{103}_{12}$ can have a channel structure constituted by a number of nanostructures (e.g., nanosheets, nanowires, nanobridges), in accordance with some embodiments of present disclosure. Although the current disclosure is directed to forming the channel structure as a combination of discrete nanostructures, it should be understood that the channel structure of the sub-transistor of the default 1 efuse cell $\mathbf{103}_{12}$ can be formed as integral one-piece structure (e.g., a semiconductor fin structure), while remaining within the scope of present disclosure.

In some embodiments, the layout 500 has its portion configured to form the WL transistor substantially similar to the portion of the layout 300 (e.g., the active regions 302-304 and the gate structures 310 to 345), and thus, the following description of the layout 500 will be focused on the difference. For example in FIG. 5, the layout 500 includes patterns 502 and 504 that are each configured to form an active region (hereinafter "active region 502," and "active region 504," "respectively); and patterns 510, 515, 520, 525, 530, 535, 540, and 545 that are each configured to form a gate structure (hereinafter "gate structure 510," "gate structure 515," "gate structure 520," "gate structure 525," "gate structure 530," "gate structure 535," "gate structure 540," and "gate structure 545," respectively). The sub-transistors of the WL transistor of the default 1 efuse cell $\mathbf{103}_{12}$ can be formed by the active regions 502 to 504 and the gate structures 510 to 545.

The layout 500 further includes patterns 550, 555, 560, 562, 564, 566, 568, 570, 572, 574, 576, and 578 that are each configured to form a metal structure/track (hereinafter "metal track 550," "metal track 555," "metal track 560," "metal track 562," "metal track 564," "metal track 566," "metal track 568," "metal track 570," "metal track 572," "metal track 574," "metal track 576," and "metal track 578," respectively). In some embodiments, these metal tracks 550 to 578 are formed across a plural number of metallization layers disposed over the major surface of the substrate (e.g., along which the WL transistor or its sub-transistors are formed). Such metallization layers are sometimes referred to as M0 layer, M1 layer, M2 layer, etc., where the M0 layer may be the closest one to the major surface of the substrate. Each of the metallization layers includes a number of metal tracks embedded in one or more corresponding inter-layer dielectric (ILD) materials or inter-metal dielectric (IMD) materials.

In comparison with the WL transistor (or its sub-transistors) that are typically referred to as being formed in a front-end-of-line (FEOL) network, the metallization layers are typically referred to as being formed in a back-end-of-line (BEOL) network. Although not shown purely for brevity purposes, the layout 500 can include a number of patterns to form respective middle-end-of-line (MEOL) metal structures. Such MEOL metal structures can electrically couple one or more of the FEOL components (e.g., the gate terminal, the drain terminal, the source terminal) to a corresponding one of the BEOL components (e.g., the metal track in any of the metallization layers). For example, the layout 500 may include patterns to form respective MD structures, each of which can be coupled to a source or drain terminal, patterns to form respective VG structures, each of which can couple a gate terminal to a metal track in M0 layer, and patterns to form respective VD structures, each of which can couple an MD structure to a metal track in M0 layer. Some of such MEOL metal structures are shown in the cross-sectional views of FIGS. 11-13, for illustrative purposes.

Referring still to FIG. 5, in some embodiments, the metal tracks 550 to 555 may be formed in M0 layer and extend along the first lateral direction (e.g., the X-direction); the metal tracks 560 to 568 may be formed in M1 layer and extend along the second lateral direction (e.g., the Y-direction); and the metal tracks 572 to 578 may be formed in M2 layer and extend along the first lateral direction (e.g., the X-direction). Accordingly, the metal tracks 550 to 555 may each sometimes be referred to as an M0 track; the metal tracks 560 to 568 may each sometimes be referred to as an M1 track; and the metal tracks 572 to 578 may each sometimes be referred to as an M2 track.

In some embodiments of the present disclosure, the M2 tracks 570 to 578 can collectively serve as a part of the fuse resistor of the default 1 efuse cell $103_{12}$ (FIG. 2). On the sides of the right end of the M2 track 570 (along the Y-direction), the M2 tracks 576 and 578 are spaced from the M2 track 570, and on the sides of the left end of the M2 track 570 (along the Y-direction), the M2 tracks 572 and 574 are spaced from the M2 track 570. Different from the layout 300 (the virgin efuse cell $103_{00}$), the metal track 570 is electrically isolated from the underlying components (e.g., the corresponding WL transistor), in some embodiments. As shown, no via structure is formed between the M2 track 570 and any of the underlying M1 tracks (e.g., 560 to 568). Instead, the M2 tracks 576 and 578 can be electrically coupled to the source/drain terminal of each of the sub-transistors formed below, and the M2 tracks 572 and 574 can each be electrically coupled to a BL, which can be formed as one or more metal tracks across at least one of the metallization layers. Further, in some embodiments, the M2 track 570 may be formed with a narrower width (along the Y-direction) than each of the M2 tracks 572 to 578, but the M2 track 570 may be formed with a longer length (along the X-direction) than each of the M2 tracks 572 to 578.

The layout 500 further includes patterns to form via structures that are each configured to electrically couple a first metal track in a lower metallization layer to a second metal track in an upper metallization layer. For example, each of the M0 tracks 550 and 550 is electrically coupled to a number of sub-transistors formed therebelow (not expressly shown in FIG. 5), and to a number of M1 tracks formed thereupon through a number of via structures 582, each of which is sometimes referred to as a V0 structure. Similarly, each of the M2 tracks 572 to 578 is electrically coupled to a number of M1 tracks formed therebelow through a number of via structures 584, 588, 590, and 594, etc., each of which is sometimes referred to as a V1 structure.

As such, the M2 tracks 576 and 578 can be coupled to the underlying WL transistor through the V1 structures 590-594, the M1 tracks 566-568, the corresponding V0 structures 582, and the M0 tracks 550-555; and the M2 tracks 570 to 574 (or just 572 and 574) can be coupled to the BL which may be formed in the next upper M3 layer through a number of via structures (not shown), according to some embodiments. In some other embodiments, the BL can be formed in any of various other upper metallization layer, or on a backside of the substrate, while remaining within the scope of the present disclosure. Operatively, the M2 tracks 572 and 574 are each formed to couple to the BL and the M2 tracks 576 and 578 are each formed to couple to the underlying WL transistor. As each of the M2 tracks 572 and 574 is electrically isolated from any of the M2 tracks 576 or 578, an open circuit is formed between the BL and the WL transistor. The M2 tracks 572 and 576 (or 574 and 578) may sometimes be referred to as open tracks. Further, the width of the M2 track 570 is substantially narrower than the width of each of the M2 tracks 572 to 578. Consequently, the default 1 efuse cell $103_{12}$ can present logic 1 (an open circuit equivalently across its fuse resistor), as fabricated, and such logic 1 cannot be altered even applied with a programming voltage.

In the illustrative embodiment of FIG. 5, the left end of the M2 track 570 is not coupled to any of the M1 tracks 560 to 564, and these M1 tracks 560 to 564 may not be coupled to the underlying WL transistor. Stated another way, no V0 structure 582 is formed between the M0 track 550/555 and the M1 track 560/562/564. The right end of the M2 track 570 is not coupled to any of the M1 tracks 566 to 568, either, but these M1 tracks 566 to 568 may be coupled to the underlying WL transistor through at least a number of the V0 structures 582 and the M0 tracks 550-555. Further, although three M1 tracks (e.g., 560-564) decoupled from the WL transistor and two M1 tracks (e.g., 566 and 568) coupled to the WL transistor are illustrated in FIG. 5, it should be understood that the layout 500 can include any number of M1 tracks formed on either end of the M2 track 570 (e.g., symmetric numbers) while remaining within the scope of the present disclosure.

Figure 6:
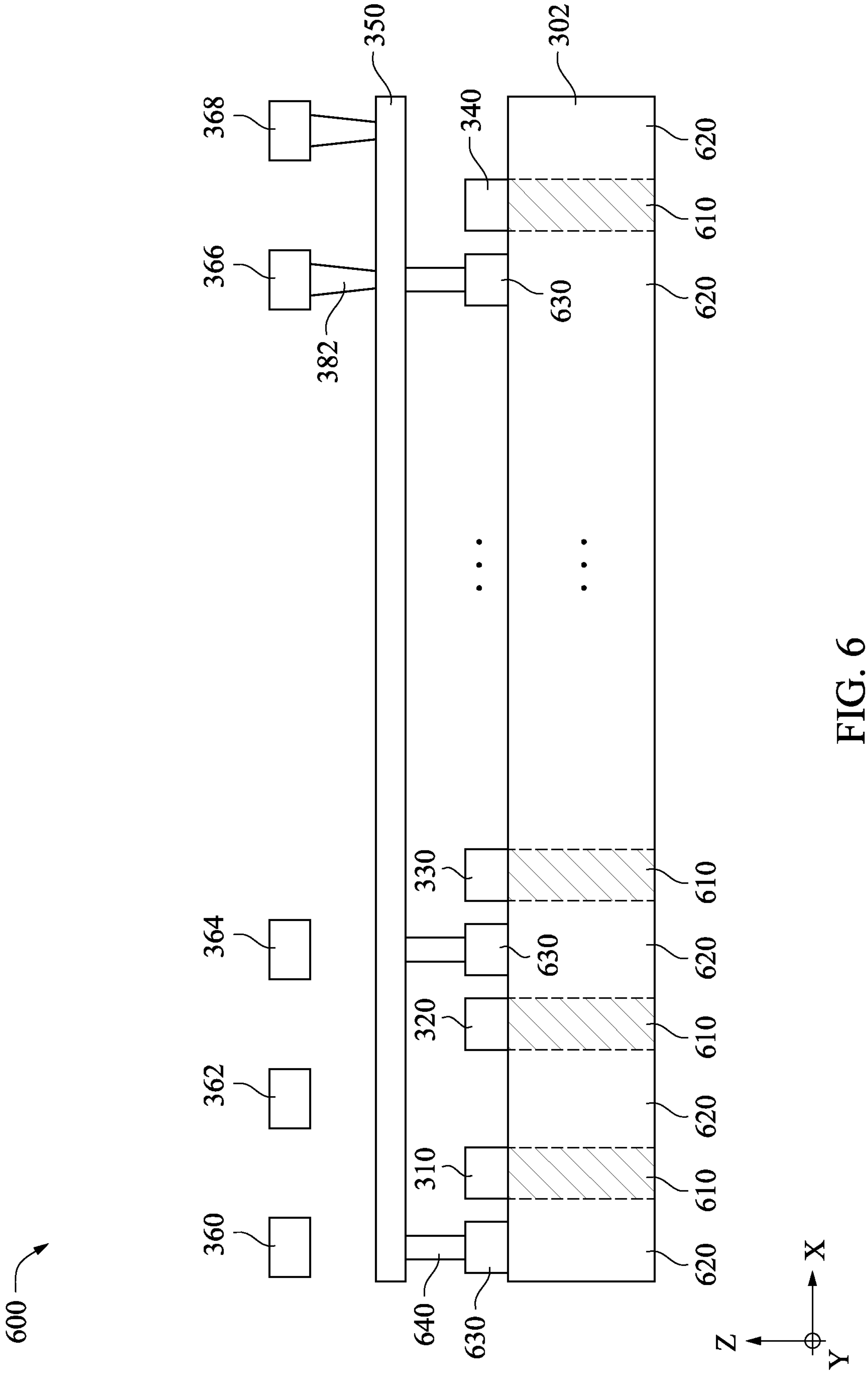
FIGS. 6 and 7 illustrate cross-sectional views of a semiconductor device formed based on the layout of FIG. 3, in accordance with some embodiments.
Figure 7:
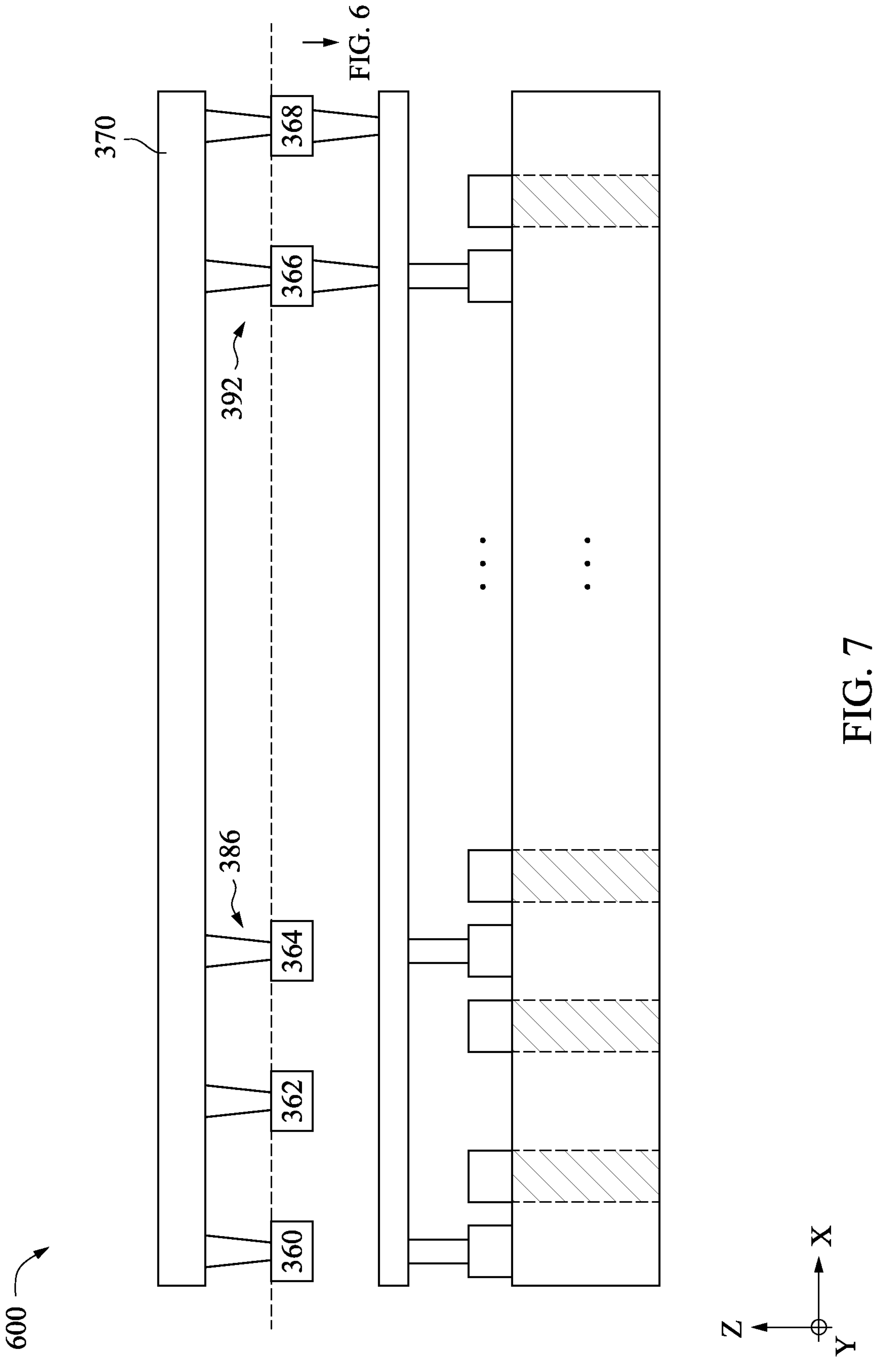

FIGS. 6 and 7 each illustrate a cross-sectional view of a semiconductor device 600 that can be formed according to the layout 300 of FIG. 3, in accordance with some embodiments. As such, the semiconductor device 600 may include at least one virgin efuse cell $103_{00}$. In some embodiments, the cross-sectional view of FIG. 6 is cut along a lengthwise direction of the active region 302, and the cross-sectional view of FIG. 7 is cut along a lengthwise direction of the M2 track 370. It should be appreciated that the cross-sectional view of FIG. 7 also includes the cross-sectional view of FIG. 6 as a reference. Accordingly, some of the references of FIG. 3 will be reused in the following discussion of the semiconductor device 600.

Referring first to FIG. 6, along the active region 302, a number of channels 610 and epitaxial structures 620 can be formed. Each of the channels 610 can be overlaid or wrapped by a corresponding one of the gate structures, e.g., 310, 320, 330, 340, and some of the epitaxial structures can be overlaid by a corresponding MD, e.g., 630. As discussed above, at least a portion of the WL transistor of the virgin efuse cell $103_{00}$ can be formed by the active region 302 and the gate structures 310 to 340. For example, a first subset of the sub-transistors of the WL transistor are formed by the active region 302 and the gate structures 310 to 340, while a second subset of the sub-transistors of the WL transistor are formed by the active region 304 and the gate structures 315, 325, 335, and 345 (not shown in the example cross-sectional view of FIG. 6).

Further, these sub-transistors can coupled to one another in parallel. Accordingly, every other epitaxial structure 620 is coupled to one or more metal tracks formed thereupon through a respective one of the MDs 630. For example, the MDs 630 shown in FIG. 6 are coupled to the M0 track 350 through a number of VD structures 640. Further, as discussed with respect to FIG. 3, the M0 track 350 has one (e.g., right) end coupled to the above metal track(s), while the other (e.g., left) end isolated from the above metal track(s). Accordingly, the V0 structures 382 exist only between the right end of the M0 track 350 and the above M1 tracks 366 to 368, respectively.

Referring next to FIG. 7, the M2 track 370 is shown as being coupled to the M1 tracks 360 to 368 through a number of V1 structures 386 and 392, respectively. Stated another way, to form the virgin efuse cell $\mathbf{103}_{00}$, the M2 track 370 (which operatively serves as at least a portion of its fuse resistor), each of the M1 tracks (e.g., shown in the layout 300 of FIG. 3) is coupled to the M2 track 370 through a corresponding one of the V1 structures 386/392, regardless of whether the M1 track is coupled to the underlying WL transistor. As such, the virgin efuse cell (or its fuse resistor, e.g., M2 track 370) is programmable.

Figure 8:
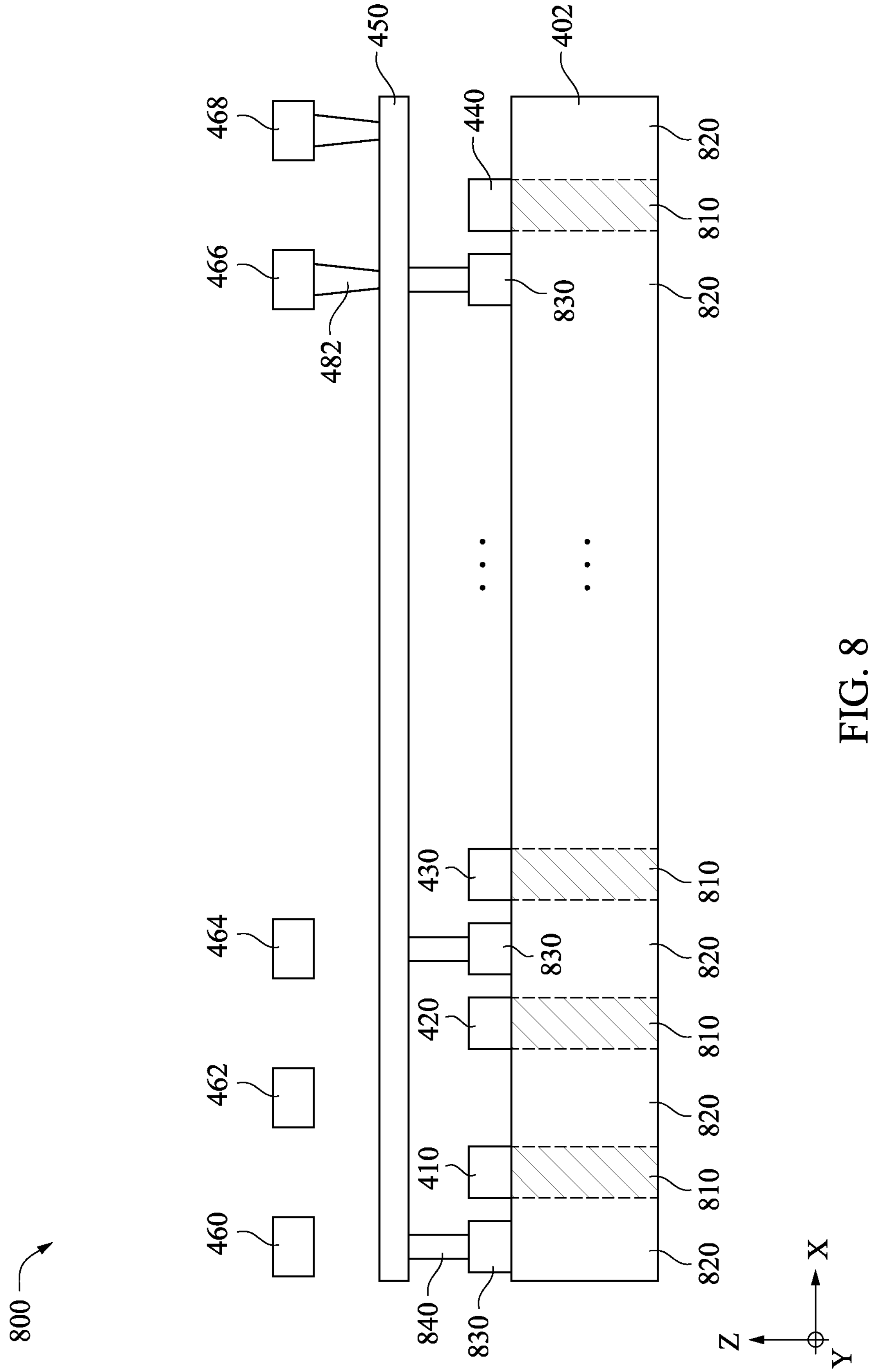
FIGS. 8, 9, and 10 illustrate cross-sectional views of a semiconductor device formed based on the layout of FIG. 4, in accordance with some embodiments.
Figure 9:
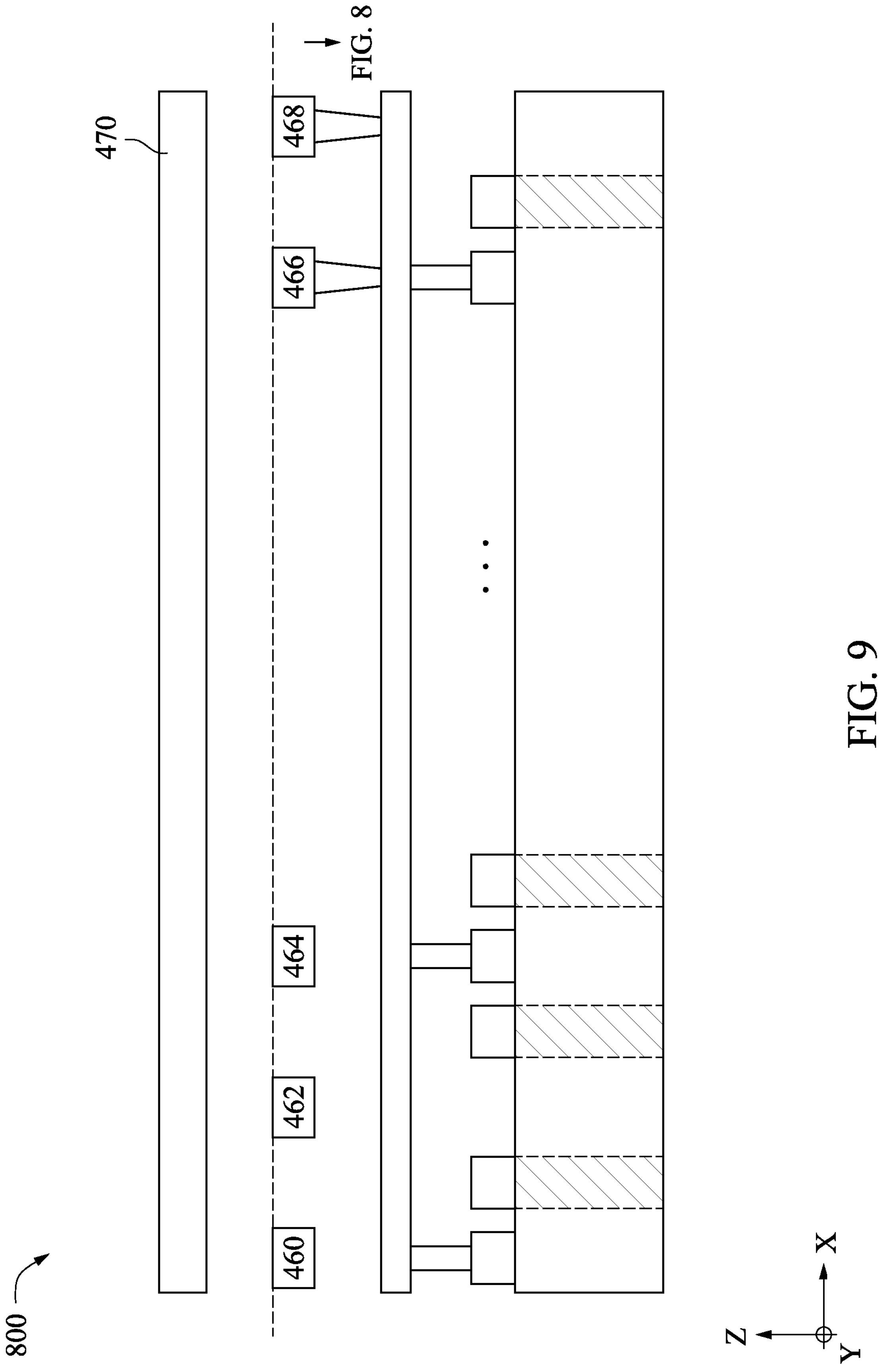
Figure 10:
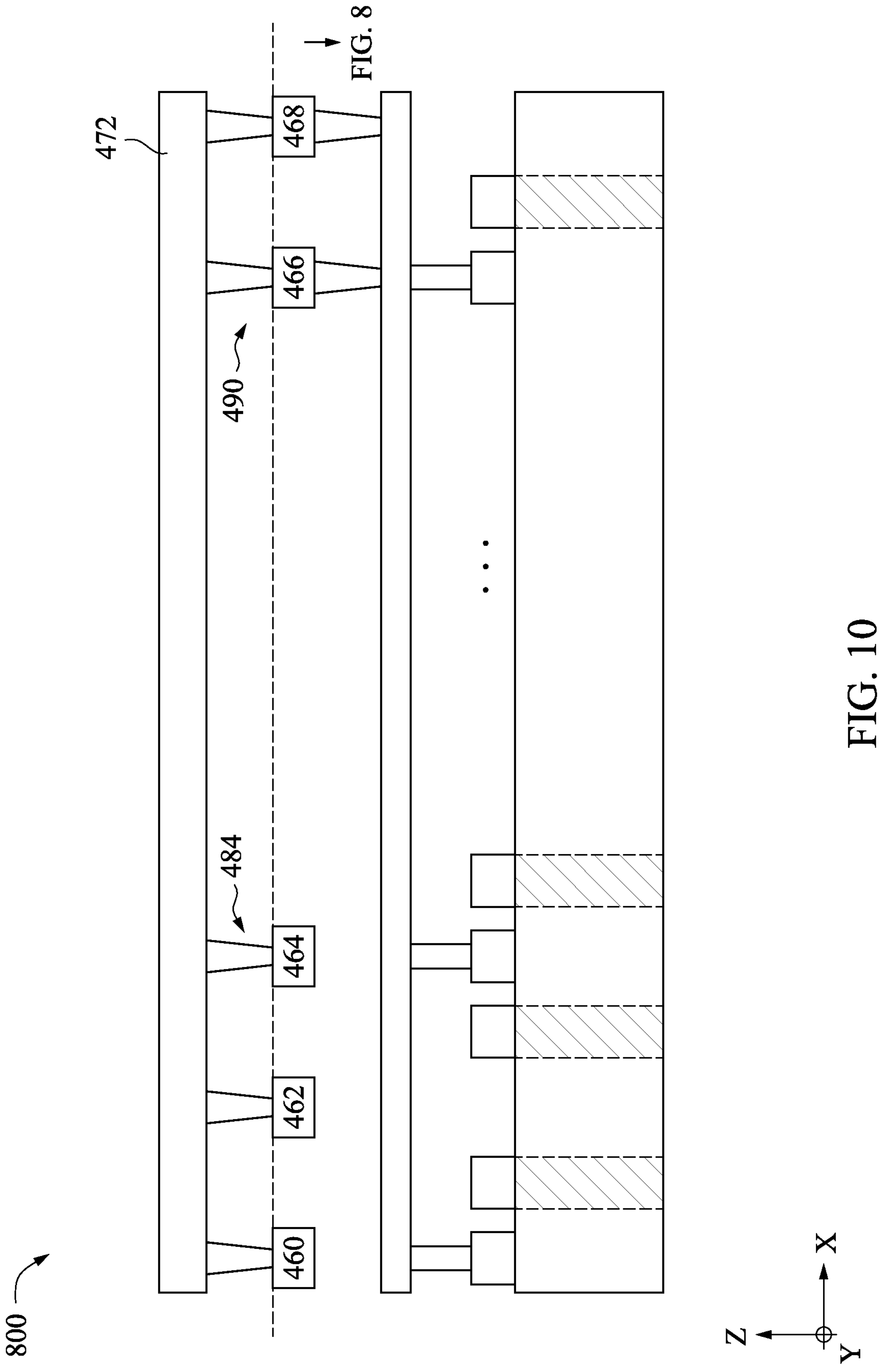

FIGS. 8, 9, and 10 each illustrate a cross-sectional view of a semiconductor device 800 that can be formed according to the layout 400 of FIG. 4, in accordance with some embodiments. As such, the semiconductor device 800 may include at least one default 0 efuse cell $\mathbf{103}_{21}$. In some embodiments, the cross-sectional view of FIG. 8 is cut along a lengthwise direction of the active region 402, the cross-sectional view of FIG. 9 is cut along a lengthwise direction of the M2 track 470, and the cross-sectional view of FIG. 10 is cut along a lengthwise direction of the M2 track 472. It should be appreciated that the cross-sectional views of FIGS. 9 and 10 each also include the cross-sectional view of FIG. 8 as a reference. Accordingly, some of the references of FIG. 4 will be reused in the following discussion of the semiconductor device 800.

Referring first to FIG. 8, along the active region 402, a number of channels 810 and epitaxial structures 820 can be formed. Each of the channels 810 can be overlaid or wrapped by a corresponding one of the gate structures, e.g., 410, 420, 430, 440, and some of the epitaxial structures can be overlaid by a corresponding MD, e.g., 830. As discussed above, at least a portion of the WL transistor of the default 0 efuse cell $\mathbf{103}_{21}$ can be formed by the active region 402 and the gate structures 410 to 440. For example, a first subset of the sub-transistors of the WL transistor are formed by the active region 402 and the gate structures 410 to 440, while a second subset of the sub-transistors of the WL transistor are formed by the active region 404 and the gate structures 415, 425, 435, and 445 (not shown in the example cross-sectional view of FIG. 8).

Further, these sub-transistors can coupled to one another in parallel. Accordingly, every other epitaxial structure 820 is coupled to one or more metal tracks formed thereupon through a respective one of the MDs 830. For example, the MDs 830 shown in FIG. 8 are coupled to the M0 track 450 through a number of VD structures 840. Further, as discussed with respect to FIG. 4, the M0 track 450 has one (e.g., right) end coupled to the above metal track(s), while the other (e.g., left) end isolated from the above metal track(s). Accordingly, the V0 structures 482 exist only between the right end of the M0 track 450 and the above M1 tracks 466 to 468, respectively.

Referring next to FIG. 9, the M2 track 470 is shown as being decoupled from any of the M1 tracks 460 to 468. Stated another way, to form the default 0 efuse cell $\mathbf{103}_{21}$, each of the M1 tracks (e.g., shown in the layout 400 of FIG. 4) is decoupled from the M2 track 470 (which operatively serves as at least a portion of its fuse resistor), regardless of whether the M1 track is coupled to the underlying WL transistor. As such, the default 0 efuse cell (or its fuse resistor, e.g., M2 track 470) is not programmable. Instead, those M1 tracks, as fabricated, are coupled to one another (e.g., forming a short circuit) through another M2 track, e.g., 472, and the V1 structures 484 and 490, as shown in the cross-sectional view of FIG. 10. Accordingly, the fuse resistor of the default 0 efuse cell, by default, presents logic 0 according to the short circuit.

Figure 11:
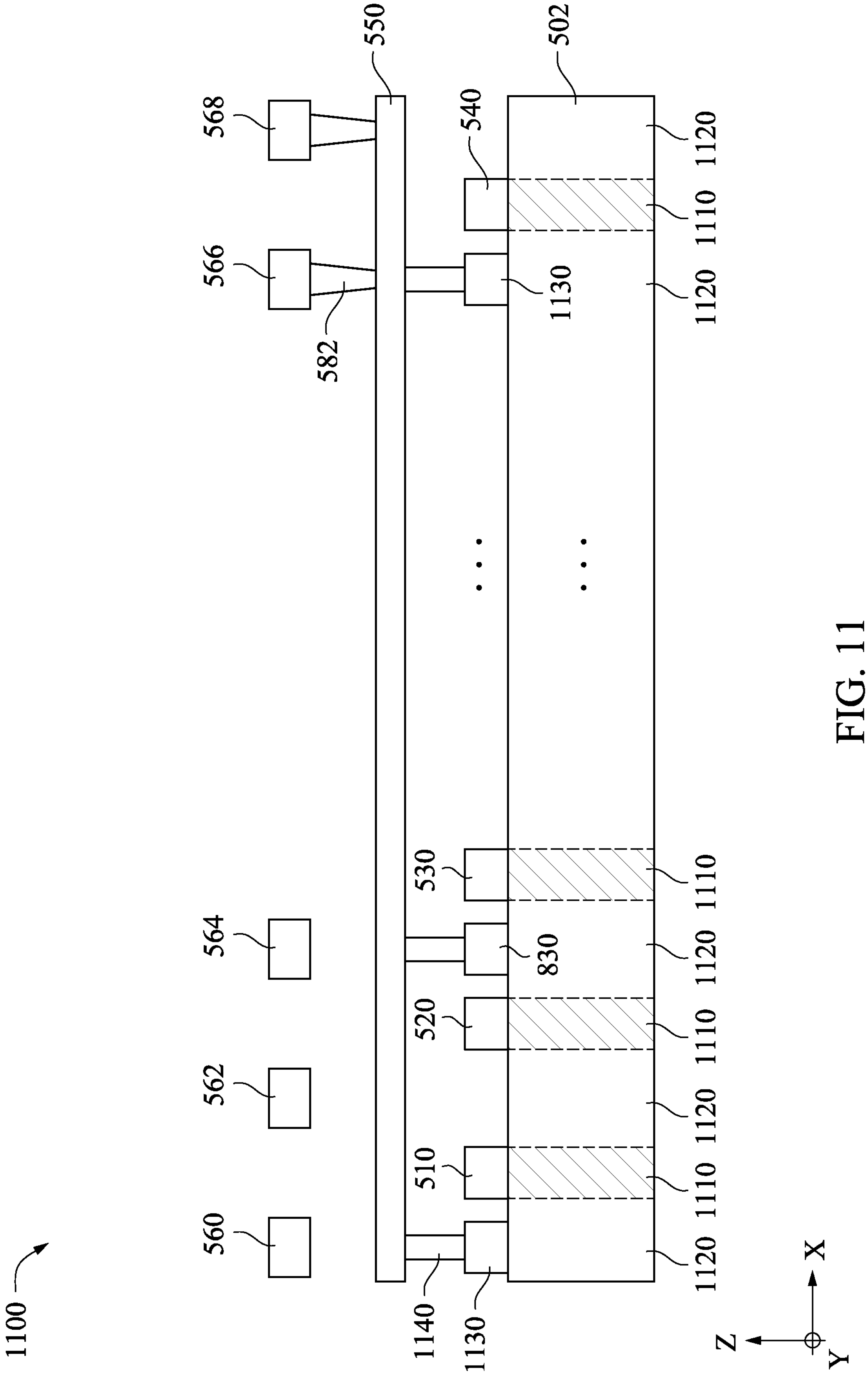
FIGS. 11, 12, and 13 illustrate cross-sectional views of a semiconductor device formed based on the layout of FIG. 5, in accordance with some embodiments.
Figure 12:
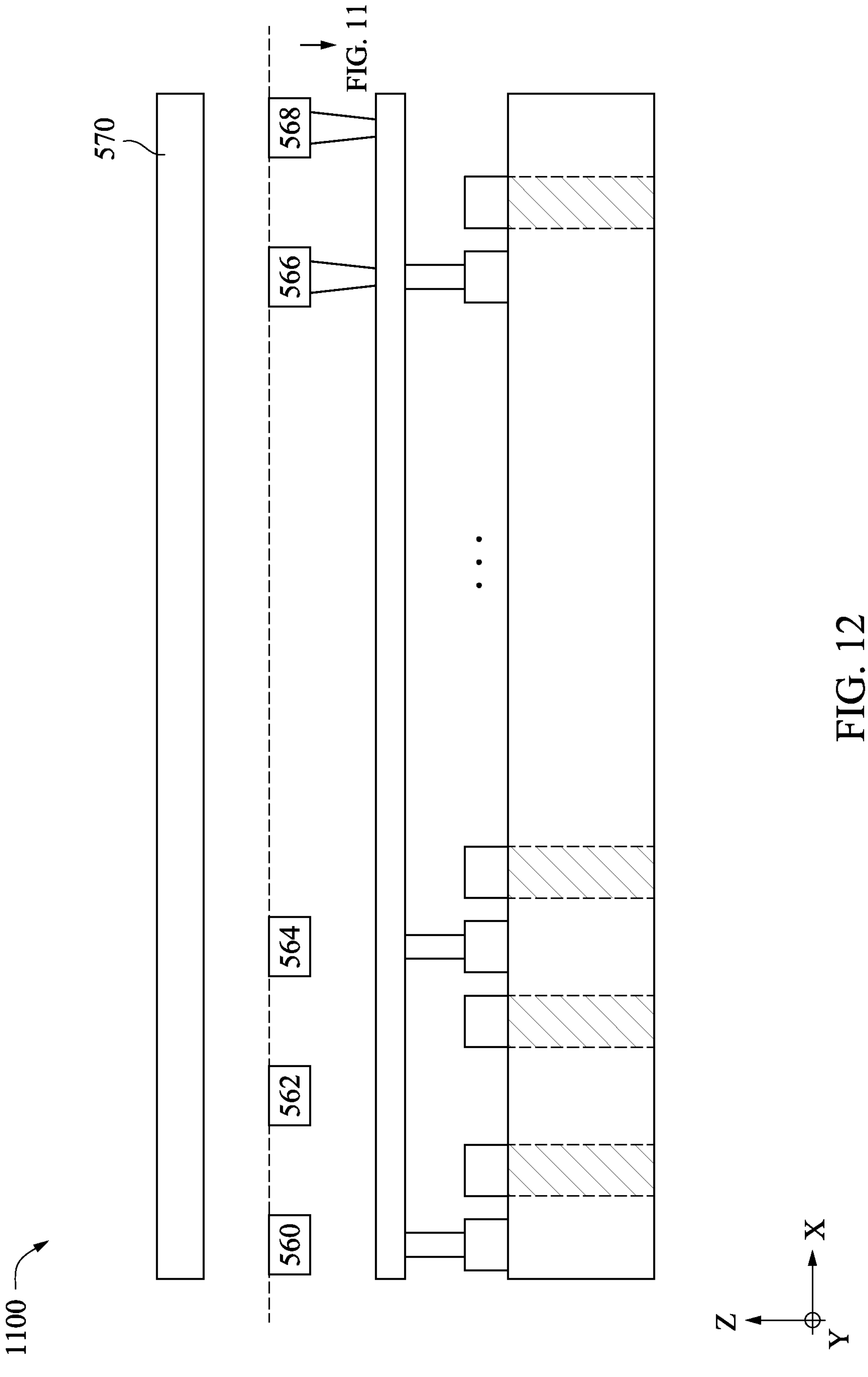
Figure 13:
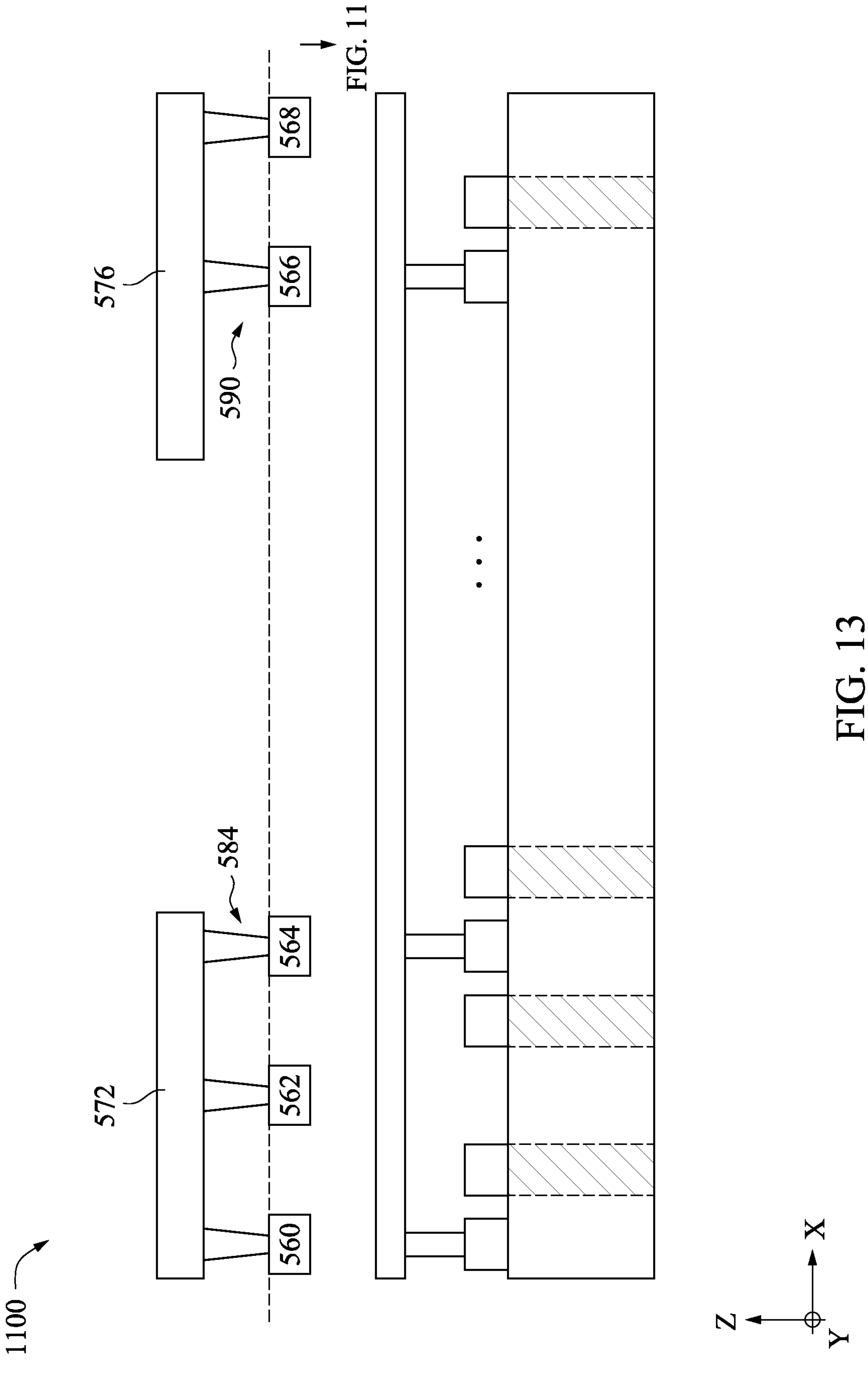

FIGS. 11, 12, and 13 each illustrate a cross-sectional view of a semiconductor device 1100 that can be formed according to the layout 500 of FIG. 5, in accordance with some embodiments. As such, the semiconductor device 1100 may include at least one default 1 efuse cell $\mathbf{103}_{12}$. In some embodiments, the cross-sectional view of FIG. 11 is cut along a lengthwise direction of the active region 502, the cross-sectional view of FIG. 12 is cut along a lengthwise direction of the M2 track 570, and the cross-sectional view of FIG. 13 is cut along a lengthwise direction of the M2 tracks 572/576. It should be appreciated that the cross-sectional views of FIGS. 12 and 13 each also include the cross-sectional view of FIG. 11 as a reference. Accordingly, some of the references of FIG. 5 will be reused in the following discussion of the semiconductor device 1100.

Referring first to FIG. 11, along the active region 502, a number of channels 1110 and epitaxial structures 1120 can be formed. Each of the channels 1110 can be overlaid or wrapped by a corresponding one of the gate structures, e.g., 510, 520, 530, 540, and some of the epitaxial structures can be overlaid by a corresponding MD, e.g., 1130. As discussed above, at least a portion of the WL transistor of the default 1 efuse cell $\mathbf{103}_{12}$ can be formed by the active region 502 and the gate structures 510 to 540. For example, a first subset of the sub-transistors of the WL transistor are formed by the active region 502 and the gate structures 510 to 540, while a second subset of the sub-transistors of the WL transistor are formed by the active region 504 and the gate structures 515, 525, 535, and 545 (not shown in the example cross-sectional view of FIG. 11).

Further, these sub-transistors can coupled to one another in parallel. Accordingly, every other epitaxial structure 1120 is coupled to one or more metal tracks formed thereupon through a respective one of the MDs 1130. For example, the MDs 1130 shown in FIG. 11 are coupled to the M0 track 550 through a number of VD structures 1140. Further, as discussed with respect to FIG. 5, the M0 track 550 has one (e.g., right) end coupled to the above metal track(s), while the other (e.g., left) end isolated from the above metal track(s). Accordingly, the V0 structures 582 exist only between the right end of the M0 track 550 and the above M1 tracks 566 to 568, respectively.

Referring next to FIG. 12, the M2 track 570 is shown as being decoupled from any of the M1 tracks 560 to 568. Stated another way, to form the default 1 efuse cell $\mathbf{103}_{12}$, each of the M1 tracks (e.g., shown in the layout 500 of FIG. 5) is decoupled from the M2 track 570 (which operatively serves as at least a portion of its fuse resistor), regardless of whether the M1 track is coupled to the underlying WL transistor. As such, the default 1 efuse cell (or its fuse resistor, e.g., M2 track 570) is not programmable. Instead, those M1 tracks, as fabricated, are grouped to two subsets decoupled from each other (e.g., forming an open circuit), as shown in the cross-sectional view of FIG. 13. Specifically, the first subset of M1 tracks 560 to 564 are coupled to the M2 track 572 and the second subset of M1 tracks 566 to 568 are coupled to the M2 track 576, in which the M2 track 572 and the M2 track 576 are physically spaced and electrically isolated from each other. Accordingly, the fuse resistor of the default 1 efuse cell, by default, presents logic 1 according to the open circuit.

Figure 14:
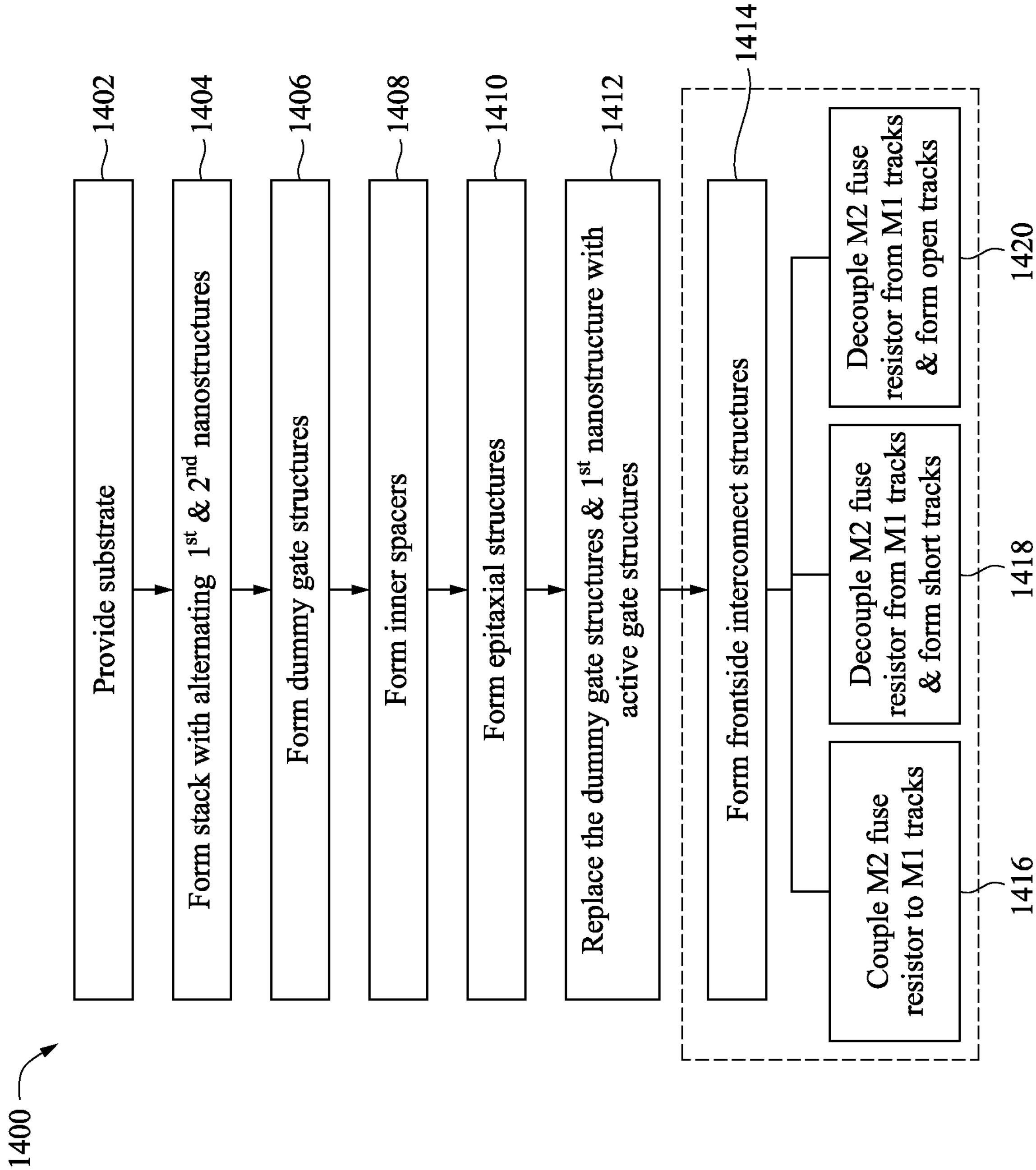
FIG. 14 illustrates a flow chart of an example method for fabricating a memory device including a virgin efuse cell, a default 0 efuse cell, and a default 1 efuse cell, in accordance with some embodiments.

FIG. 14 illustrates a flow chart of an example method 1400 for forming a memory device including a memory array, in accordance with some embodiments. The memory array includes a number of virgin efuse cells, a number of default 0 efuse cells, a number of default 1 efuse cells. In some embodiments, the method 1400 can be performed to form a memory device based on the layouts 300, 400, and 500 shown in FIGS. 3, 4, and 5, respectively, and thus, some of the references of FIGS. 3-5 (and associated cross-sectional views of FIGS. 6-13) may be reused in the following discussion of the method 1400. It is noted that the method 1400 is merely an example and is not intended to limit the present disclosure. Accordingly, it is understood that additional operations may be provided before, during, and after the method 1400 of FIG. 14, and that some other operations may only be briefly described herein.

The method 1400 starts with operation 1402 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 1400 continues to operation 1404 in which a stack, including an alternating series of first nanostructures and second nanostructures, is formed, in accordance with various embodiments. Such a stack can be formed based on one of the (active region) patterns discussed above. The stack can be formed in a frontside of the substrate. In some embodiments, the first nanostructures may include SiGe sacrificial nanostructures, and the second nanostructures may include Si channel nanostructures. Such a stack may sometimes be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 1400 continues to operation 1406 in which a number of dummy gate structures are formed, in accordance with various embodiments. Such a dummy gate structure can be formed based on one of the (gate structure) patterns discussed above. The dummy gate structure can extend along a direction perpendicular to the lengthwise direction of the dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

The method 1400 proceeds to operation 1408 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin structure), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 1400 proceeds to operation 1410 in which a number of epitaxial structures are formed, in accordance with various embodiments. Upon forming the inner spacers, the epitaxial structures are formed using an epitaxial layer growth process on exposed ends of the Si nanostructures. In situ (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 1400 proceeds to operation 1412 in which the dummy gate structures and the remaining SiGe sacrificial nanostructures are replaced with respective active gate structures, in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures being formed, respective WL transistors of the disclosed efuse memory cells, including the virgin efuse cells, default 0 efuse cells, and default 1 efuse cells, can be formed.

The method 1400 proceeds to operation 1414 in which a number of frontside interconnect structures are formed, in accordance with various embodiments. Upon forming the WL transistors, a number of middle-end interconnect structures (e.g., VGs, VDs, MDs) are formed over the WL transistors. For example, a number of VGs can be formed to connect to gate terminals of the WL transistor(s), respectively, and a number of MDs can be formed to connect to source/drain terminals of the WL transistor(s), respectively. Further, a number of back-end metal tracks (e.g., M0 tracks, M1 tracks, M2 tracks, etc.) can be formed over the middle-end interconnect structures.

The frontside interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The frontside interconnect structures can be formed by overlaying the frontside of the substrate with the above-listed metal material by, for example, chemical vapor deposition (CVD), physical vapor deposition (PVD), electroless plating, electroplating, or combinations thereof.

In some embodiments, respective fuse resistors of the disclosed virgin efuse cells, default 0 efuse cells, and default 1 efuse cells can each be formed by coupling or decoupling these back-end metal tracks. For example, operation 1414 may further include operation 1416 of coupling an M2 track (fuse resistor) to M1 tracks, operation 1418 of decoupling an M2 track (fuse resistor) from M1 tracks and forming short tracks, and operation 1420 of decoupling an M2 track (fuse resistor) from M1 tracks and forming open tracks.

Referring first to operation 1416 (and in conjunction with FIGS. 3, 6, and 7), the M2 track 370, which serves as at least a part of the fuse resistor of the virgin efuse cell $\mathbf{103}_{00}$, is coupled to the underlying M1 tracks 360 to 368 through V1 structures 386 and 392. Further, the M2 track 370 is (e.g., downwardly) coupled to the WL transistor formed by the active regions 302 to 304 and gate structures 310 to 345, through the M1 tracks 366-368, M0 tracks 350-355, VDs 640, and MDs 630; and the M2 track 370 is (e.g., upwardly) coupled to the BL formed thereon. As such, the M2 track 370 is programmable (e.g., from a short circuit to an open circuit) through the BL and the activated WL transistor.

Referring next to operation 1418 (and in conjunction with FIGS. 4, 8, 9, and 10), the M2 track 470, which serves as at least a part of the fuse resistor of the virgin efuse cell $\mathbf{103}_{21}$, is decoupled from any of the underlying M1 tracks 460 to 468. Further, the M2 tracks 472 and 474 are each (e.g., downwardly) coupled to the WL transistor formed by the active regions 402 to 404 and gate structures 410 to 445, through the M1 tracks 466-468, M0 tracks 450-455, VDs 840, and MDs 830; and the M2 tracks 472 and 474 are each (e.g., upwardly) coupled to the BL formed thereon. As such, with the M2 track 470 being unprogrammable (by, e.g., not connecting to the underlying WL transistor), the M2 tracks 472 and 474 are each formed as a short circuit to electrically connect the WL transistor to the BL, thereby presenting logic 0 upon being fabricated.

Referring next to operation 1420 (and in conjunction with FIGS. 5, 11, 12, and 13), the M2 track 570, which serves as at least a part of the fuse resistor of the virgin efuse cell $\mathbf{103}_{12}$, is decoupled from any of the underlying M1 tracks 560 to 568. Further, the M2 tracks 576 and 578 are each (e.g., downwardly) coupled to the WL transistor formed by the active regions 502 to 504 and gate structures 510 to 545, through the M1 tracks 566-568, M0 tracks 550-555, VDs 1140, and MDs 1130; and the M2 tracks 572 and 574 are each (e.g., upwardly) coupled to the BL formed thereon. As such, with the M2 track 570 being unprogrammable (by, e.g., not connecting to the underlying WL transistor), the pair of M2 tracks 572 and 576 (and the pair of M2 tracks 574 and 578) are each formed as an open circuit to electrically disconnect the WL transistor from the BL, thereby presenting logic 1 upon being fabricated.

Figure 15:
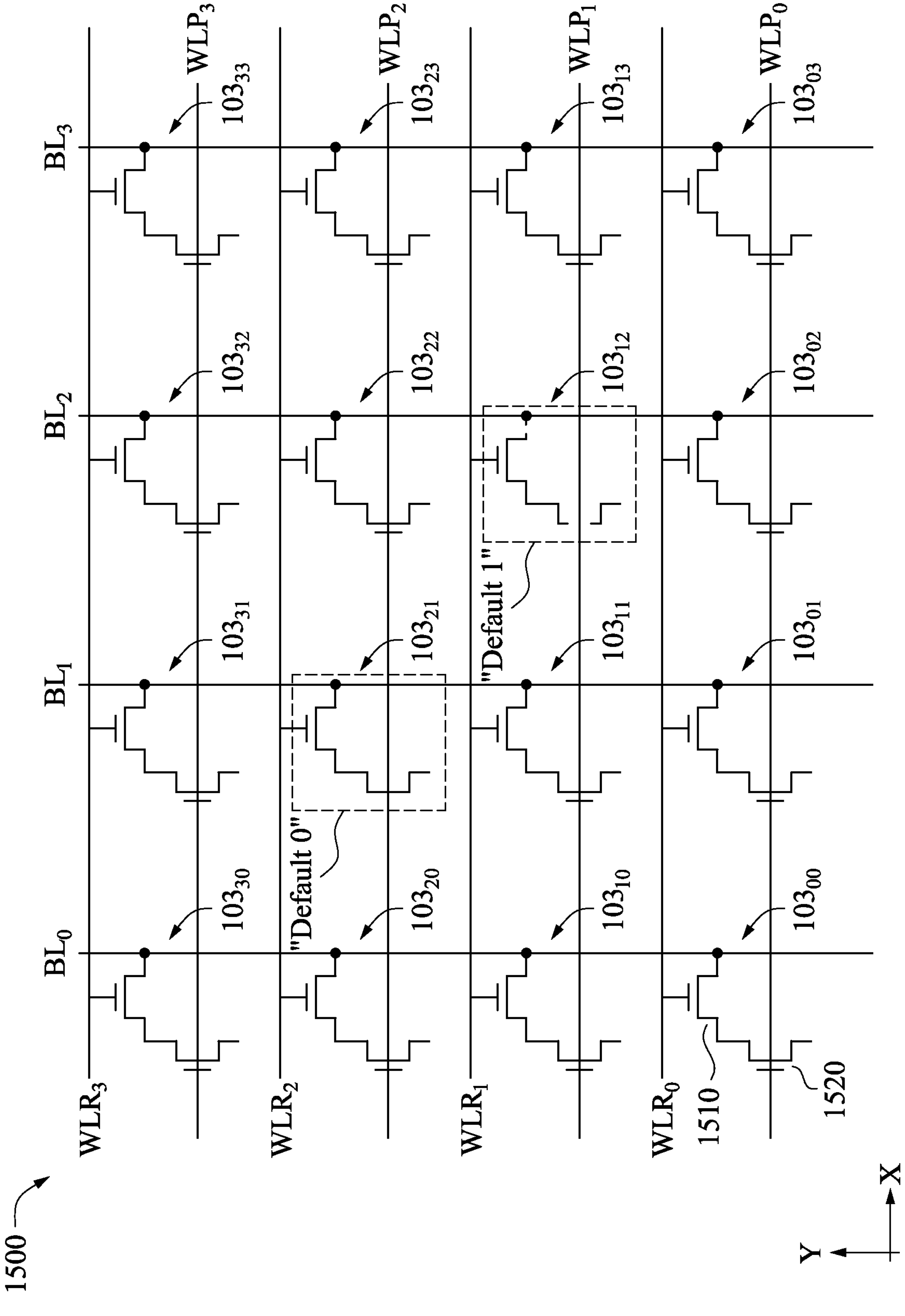
FIG. 15 illustrates a schematic diagram of a portion of the memory array of FIG. 1, in which each of its memory cells is implemented as an anti-fuse memory cell, in accordance with some embodiments.

FIG. 15 illustrates a schematic diagram 1500 of a portion of the memory device 100 (e.g., some of the memory cells 103) in which each of the memory cells 103 is implemented as an anti-fuse memory cell, in accordance with some embodiments. In the illustrated examples of FIG. 15, anti-fuse memory cells $\mathbf{103}_{00}$, $\mathbf{103}_{01}$, $\mathbf{103}_{02}$, $\mathbf{103}_{03}$, $\mathbf{103}_{10}$, $\mathbf{103}_{11}$, $\mathbf{103}_{12}$, $\mathbf{103}_{13}$, $\mathbf{103}_{20}$, $\mathbf{103}_{21}$, $\mathbf{103}_{22}$, $\mathbf{103}_{23}$, $\mathbf{103}_{30}$, $\mathbf{103}_{31}$, $\mathbf{103}_{32}$, and $\mathbf{103}_{33}$ of the memory array 102 are shown, in which the first subscript and the second subscript may represent its corresponding row and column, respectively. Although sixteen anti-fuse memory cells $\mathbf{103}_{00}$ to $\mathbf{103}_{33}$ are shown, it should be appreciated that the memory array 102 can have any number of similar anti-fuse memory cells, while remaining within the scope of present disclosure.

As shown, each of the anti-fuse memory cells $\mathbf{103}_{00}$ to $\mathbf{103}_{33}$ consists of a programming transistor and a reading transistor connected to each other in series, and is operatively connected to one programming WL, one reading WL, and one BL. The programming and reading WLs are disposed in the corresponding row, and the BL is disposed in the corresponding column. Using the anti-fuse memory cell $\mathbf{103}_{00}$ as a representative example, the anti-fuse memory cell $\mathbf{103}_{00}$ consists of a programming transistor 1510 and a reading transistor 1520 connected in series, and is disposed at an intersection of $BL_0$ and $WLP/R_0$ (column $C_0$ and row $R_0$). The programming transistor 1510 has a first source/drain terminal floating and a second source/drain terminal connected to a first source/drain terminal of the reading transistor 1520. The reading transistor 1520 has a second source/drain terminal connected to the $BL_0$. The programming transistor 1510 and the reading transistor 1520 have their gate terminals connected to the $WLP_0$ and $WLR_0$, respectively In some embodiments, both of the programming transistor 1510 and the reading transistor 1520 may be formed along the major surface of a substrate (sometimes referred to as part of "front-end-of-line (FEOL) processing/network"), which are sometimes referred to as FEOL transistors. Over the FEOL network, a number of metallization layers can be formed (sometimes referred to as part of "back-end-of-line (BEOL) processing/network"). In some other embodiments, at least one of the programming transistor 1510 and the reading transistor 1520 may be formed in the BEOL network, which are sometimes referred to as BEOL transistors. Depending on whether the anti-fuse memory cell is preconfigured as a default 0 anti-fuse cell or default 1 anti-fuse cell, its programming transistor and reading transistor may have respectively different threshold voltages. For example, the programming transistor of the default 0 anti-fuse cell may have a substantially lower threshold voltage than its reading transistor. As such, the programming transistor can be easily turned on, or stay activated most of the time (sometimes referred to "always on"). Analogously, the programming transistor of the default 1 anti-fuse cell may have a substantially higher threshold voltage than its reading transistor, which causes the programming transistor to be barely turned on, or remain deactivated most of the time (sometimes referred to "always off"). Consequently, these default anti-fuse cells can each permanently present a preconfigured logic state, upon being formed (or fabricated). Stated another way, the default anti-fuse cells, as disclosed herein, cannot be further programmed to present a desired logic state upon being fabricated, and such a logic state cannot be altered.

For example, in FIG. 15, among the anti-fuse memory cells $\mathbf{103}_{00}$ to $\mathbf{103}_{33}$, the anti-fuse memory cells $\mathbf{103}_{21}$ and anti-fuse memory cells $\mathbf{103}_{12}$ are preconfigured as a default 0 anti-fuse cell and a default 1 anti-fuse cell, respectively, while other anti-fuse memory cells remain as virgin anti-fuse cells. The term virgin anti-fuse cell, as used herein, may refer to an anti-fuse memory cell that presents an open circuit (or logic 1), as fabricated, and can be programmed to present a short circuit (or logic 0). Different from the virgin anti-fuse memory cells, the anti-fuse memory cell $\mathbf{103}_{21}$ can present logic 0, as fabricated, and cannot be programmed to logic 1, and the anti-fuse memory cell $\mathbf{103}_{12}$ can present logic 1, as fabricated, and cannot be programmed to logic 0. Respective structures or configurations of the virgin anti-fuse cell, default 0 anti-fuse cell, and default 1 anti-fuse cell will be discussed in further detail with respect to FIGS. 16, 17, and 18, respectively.

Although one default 0 anti-fuse cell and one default 1 anti-fuse cell are shown in the illustrative embodiment of FIG. 15, it should be understood that an array can include any number of default 0 anti-fuse cells and any number of default 1 anti-fuse cells. Further, in some embodiments, respective locations of the default 0 anti-fuse cell(s) and default 1 anti-fuse cell(s) in the array can also be preconfigured. With the locations of these default cells in an array known, respective functionalities of one or more peripheral circuits (e.g., sense amplifiers) operatively coupled to the array can be verified. For example, the logic state of a default cell and where such a default cell is located in an array can be preconfigured (e.g., known). If a sense amplifier operatively coupled to the default cell reads out a logic state inconsistent with the preconfigured logic state, the sense amplifier may be determined as malfunctioning. In another example, given that the logic state and the location of a default cell are both preconfigured and an operatively coupled sense amplifier has been determined as properly functioning, if the sense amplifier still reads out an inconsistent logic state. One or more other peripheral circuits (e.g., a corresponding column decoder and/or a corresponding row decoder) may be determined as malfunctioning.

Figure 16:
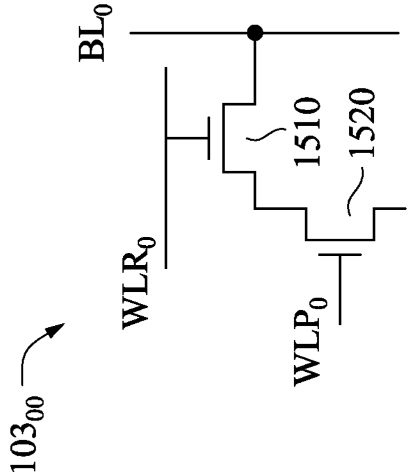
FIG. 16 illustrates an example schematic diagram of a virgin anti-fuse cell, in accordance with some embodiments.

Referring first to FIG. 16, an example schematic diagram 1600 of the virgin anti-fuse cell (e.g., $\mathbf{103}_{00}$ of FIG. 15) is illustrated, in accordance with various embodiments. Although each of the programming transistor 1520 and the reading transistor 1510 is implemented as an n-type metal-oxide-semiconductor field-effect-transistor (n-type MOSFET) or sometimes referred to as an NMOS transistor. However, it should be understood that each of the programming and reading transistors may be implemented as a p-type metal-oxide-semiconductor field-effect-transistor (p-type MOSFET), while remaining within the scope of present disclosure.

In some embodiments, the programming transistor 1520 and the reading transistor 1510 of the virgin anti-fuse cell $\mathbf{103}_{00}$ may share a similar threshold voltage. For example, a gate structure of the programming transistor 1520 may have a gate dielectric layer with a first thickness and a gate structure of the reading transistor 1510 may have a gate dielectric layer with a second thickness, in which the first thickness can be substantially similar to the second thickness. In another example, a gate structure of the programming transistor 1520 may have a gate dielectric layer with a first dielectric constant and a gate structure of the reading transistor 1510 may have a gate dielectric layer with a second dielectric constant, in which the first dielectric constant can be substantially similar to the second dielectric constant. In yet another example, a gate structure of the programming transistor 1520 may have a first combination of work function layers (leading to a first flat band voltage) and a gate structure of the reading transistor 1510 may have a second combination of work function layers (leading to a second flat band voltage), in which the first flat band voltage can be substantially similar to the second flat band voltage.

Figure 17:
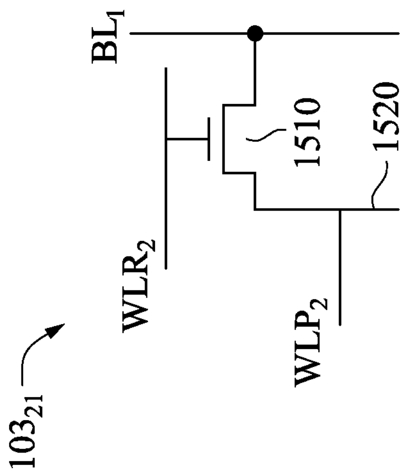
FIG. 17 illustrates an example schematic diagram of a default 0 anti-fuse cell, in accordance with some embodiments.

Referring to FIG. 17, an example schematic diagram 1700 of the default 0 anti-fuse cell (e.g., $\mathbf{103}_{21}$ of FIG. 15) is illustrated, in accordance with various embodiments. Although each of the programming transistor 1520 and the reading transistor 1510 is implemented as an n-type metal-oxide-semiconductor field-effect-transistor (n-type MOSFET) or sometimes referred to as an NMOS transistor. However, it should be understood that each of the programming and reading transistors may be implemented as a p-type metal-oxide-semiconductor field-effect-transistor (p-type MOSFET), while remaining within the scope of present disclosure.

In some embodiments, the programming transistor 1520 and the reading transistor 1510 of the default 0 anti-fuse cell $\mathbf{103}_{21}$ may have respectively different threshold voltages, in which the programming transistor 1520 can have a substantially lower threshold voltage than the reading transistor 1510. For example, a gate structure of the programming transistor 1520 may have a gate dielectric layer with a first thickness and a gate structure of the reading transistor 1510 may have a gate dielectric layer with a second thickness, in which the first thickness can be substantially thinner than the second thickness. In another example, a gate structure of the programming transistor 1520 may have a gate dielectric layer with a first dielectric constant and a gate structure of the reading transistor 1510 may have a gate dielectric layer with a second dielectric constant, in which the first dielectric constant can be substantially higher than the second dielectric constant. In yet another example, a gate structure of the programming transistor 1520 may have a first combination of work function layers (leading to a first flat band voltage) and a gate structure of the reading transistor 1510 may have a second combination of work function layers (leading to a second flat band voltage), in which the first flat band voltage can be substantially lower than the second flat band voltage.

Figure 18:
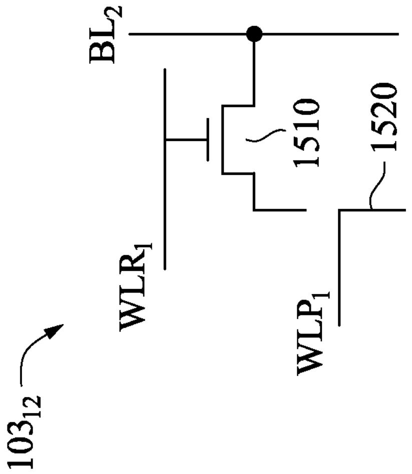
FIG. 18 illustrates an example schematic diagram of a default 1 anti-fuse cell, in accordance with some embodiments.

Referring to FIG. 18, an example schematic diagram 1800 of the default 1 anti-fuse cell (e.g., $\mathbf{103}_{12}$ of FIG. 15) is illustrated, in accordance with various embodiments. Although each of the programming transistor 1520 and the reading transistor 1510 is implemented as an n-type metal-oxide-semiconductor field-effect-transistor (n-type MOSFET) or sometimes referred to as an NMOS transistor. However, it should be understood that each of the programming and reading transistors may be implemented as a p-type metal-oxide-semiconductor field-effect-transistor (p-type MOSFET), while remaining within the scope of present disclosure.

In some embodiments, the programming transistor 1520 and the reading transistor 1510 of the default 1 anti-fuse cell $\mathbf{103}_{00}$ may have respectively different threshold voltages, in which the programming transistor 1520 can have a substantially higher threshold voltage than the reading transistor 1510. For example, a gate structure of the programming transistor 1520 may have a gate dielectric layer with a first thickness and a gate structure of the reading transistor 1510 may have a gate dielectric layer with a second thickness, in which the first thickness can be substantially thicker than the second thickness. In another example, a gate structure of the programming transistor 1520 may have a gate dielectric layer with a first dielectric constant and a gate structure of the reading transistor 1510 may have a gate dielectric layer with a second dielectric constant, in which the first dielectric constant can be substantially lower than the second dielectric constant. In yet another example, a gate structure of the programming transistor 1520 may have a first combination of work function layers (leading to a first flat band voltage) and a gate structure of the reading transistor 1510 may have a second combination of work function layers (leading to a second flat band voltage), in which the first flat band voltage can be substantially higher than the second flat band voltage.

To program the virgin anti-fuse cell $\mathbf{103}_{00}$, the reading transistor 1510 are turned on by supplying a high enough voltage (e.g., a positive voltage corresponding to a logic high state) to its gate terminal via the $WLR_0$. Prior to, concurrently with or subsequently to the reading transistor 1510 being turned on, a sufficiently high voltage (e.g., a breakdown voltage ($V_{BD}$) which is sometimes referred to as a programming voltage) is applied to the $WLP_0$, and a low enough voltage (e.g., a positive voltage or ground voltage corresponding to a logic low state) is applied to the $BL_0$. With the reading transistor 1510 being turned on, the low voltage (applied on the $BL_0$) can be passed to the source terminal of the programming transistor 1520. As such, that $V_{BD}$ can be concurrently present across one of the source/drain terminals that is non-floating (and connected to the reading transistor 1510) and the gate terminal of the programming transistor 1520, so as to break down a portion of the gate dielectric layer of the programming transistor 1520 (e.g., the portion between its gate and non-floating source/drain terminal).

After the gate dielectric layer (or a portion of the gate dielectric layer) is broken down, a behavior of the portion of the gate dielectric layer interconnecting the gate terminal and the source/drain terminal is equivalently resistive. Specifically, before the programming process, no conduction path exists, even if the reading transistor 1510 is turned on. After the programming process, a conduction path exists between the $BL_0$ and the $WLP_0$ (e.g., via the resistor formed across the broken portion of the gate dielectric layer), when the reading transistor 1510 is turned on. Accordingly, the virgin anti-fuse cell $\mathbf{103}_{00}$, which presents an open circuit (e.g., logic 1) as fabricated, and can be programmed to have a short circuit (e.g., logic 0).

In comparison, as the programming transistor 1520 of the default 0 anti-fuse cell $\mathbf{103}_{21}$ has a substantially lower threshold voltage than its reading transistor 1510, the programming transistor 1520 may have been be activated even if a low or nearly no voltage signal is applied on the $WLP_2$. Such a low threshold voltage forms a conduction path across the $WLP_2$ to the source/drain terminal of the programing transistor 1520 connected to the reading transistor 1510, upon the default 0 anti-fuse cell $\mathbf{103}_{21}$ being fabricated. Thus, when the reading transistor 1510 is turned on, a short circuit is formed from the $WLP_2$ to the $BL_1$. Accordingly, the default 0 anti-fuse cell $\mathbf{103}_{21}$ can present logic 0, even without being programmed. Similarly, as the programming transistor 1520 of the default 1 anti-fuse cell $\mathbf{103}_{12}$ has a substantially higher threshold voltage than its reading transistor 1510, the programming transistor 1520 may be barely or cannot be activated even if a high voltage signal is applied on the $WLP_1$. Such a high threshold voltage equivalently forms an open circuit across the $WLP_1$ to the source/drain terminal of the programing transistor 1520 connected to the reading transistor 1510, upon the default 1 anti-fuse cell $\mathbf{103}_{12}$ being fabricated. Further, this open circuit may barely become a short circuit, even applying a strong programming voltage on the $WLP_1$. Accordingly, the default 1 anti-fuse cell $\mathbf{103}_{12}$ can present logic 1, even applied with a programming process.

Figure 19:
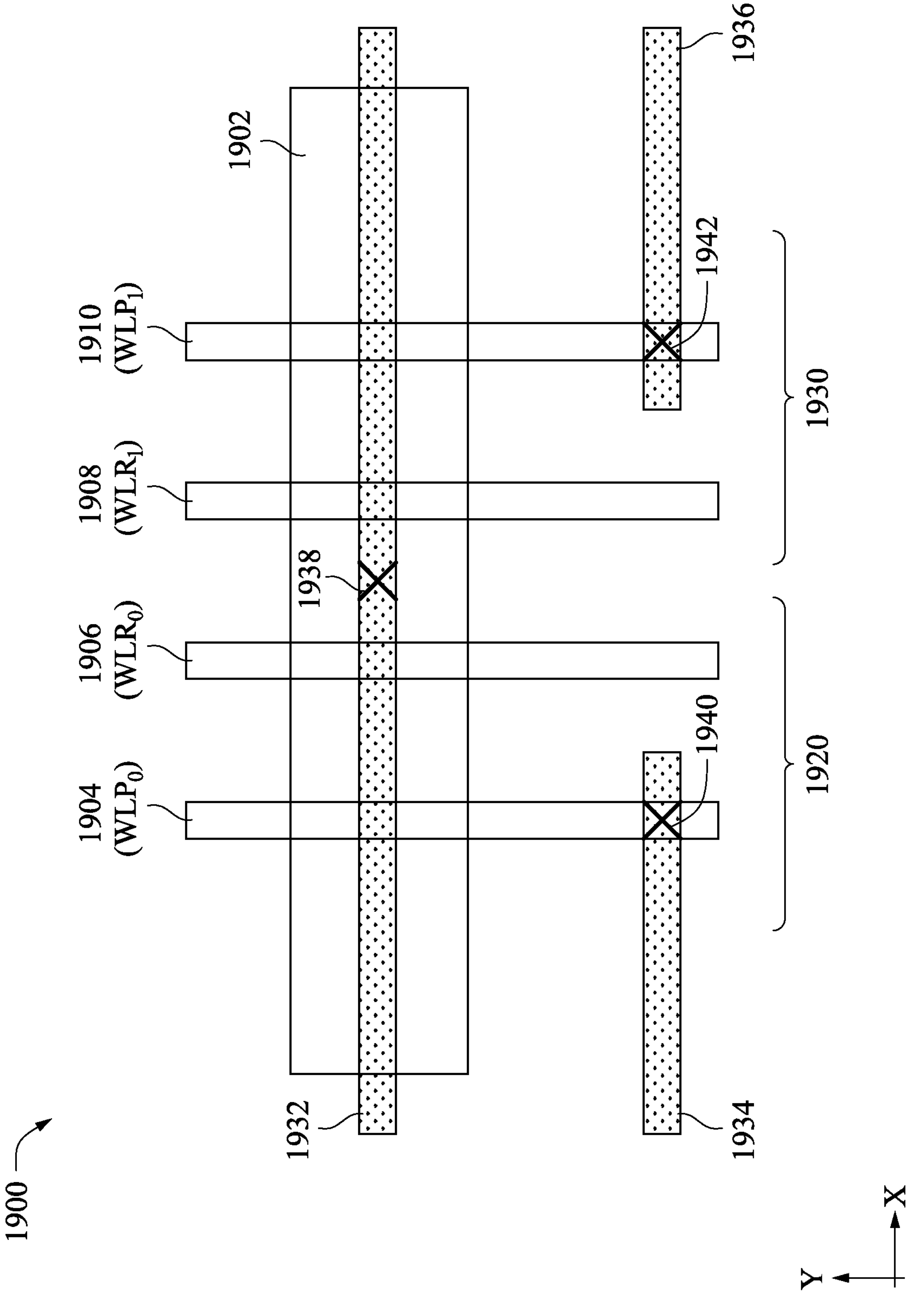
FIG. 19 illustrates an example layout configured to form a number of anti-fuse cells, in accordance with some embodiments.

In FIG. 19, an example layout 1900 that can be utilized to form a number of the anti-fuse memory cells of FIG. 15 is illustrated, in accordance with various embodiments. For example, the layout 1900 can form two anti-fuse memory cells disposed along the same column, e.g., sharing the same BL and coupled to respective WLPs and respective WLRs. In one embodiment, these two cells (formed by the layout 1900) may both be virgin anti-fuse cells. In another embodiment, these two cells (formed by the layout 1900) may both be default 0 anti-fuse cells. In yet another embodiment, these two cells (formed by the layout 1900) may both be default 1 anti-fuse cells. In yet another embodiment, one of these two cells (formed by the layout 1900) may be a virgin anti-fuse cell, while the other may be a default 1 or default 0 anti-fuse cell.

As shown, the layout 1900 includes patterns 1902, 1904, 1906, 1908, and 1910, in which the pattern 1902 is configured to form an active region (hereinafter "active region 1902"), and the patterns 1904 to 1910 are each configured to form a gate structure (hereinafter "gate structure 1904," "gate structure 1906," "gate structure 1908," and "gate structure 1910," respectively). The active region 1902 can extend along a first lateral direction (e.g., the X-direction), while the gate structures 1904 to 1910 can each extend along a second lateral direction (e.g., the Y-direction). With the active region 1902 and the gate structures 1904-1910, a first anti-fuse memory cell 1920 and a second anti-fuse memory cell 1930 can be formed. In some embodiments, the first anti-fuse memory cell 1920 can be formed by the active region 1902 and the gate structures 1904-1906; and the second anti-fuse memory cell 1930 can be formed by the active region 1902 and the gate structures 1908-1910.

For example, the portion of the active region 1902 that is overlaid by the gate structure 1904 may include a number of nanostructures vertically separated from each other, which can function as a channel of the programming transistor of the first anti-fuse memory cell 1920. The portions of the active region 1902 that are disposed on opposite sides of the gate structure 1904 are replaced with epitaxial structures. Such epitaxial structures can function as source/drain terminals of the programming transistor of the first anti-fuse memory cell 1920. The gate structure 1904 can function as a gate terminal of the programming transistor of the first anti-fuse memory cell 1920. The portion of the active region 1902 that is overlaid by the gate structure 1906 may include a number of nanostructures vertically separated from each other, which can function as a channel of the reading transistor of the first anti-fuse memory cell 1920. The portions of the active region 1902 that are disposed on opposite sides of the gate structure 1906 are replaced with epitaxial structures. Such epitaxial structures can function as source/drain terminals of the reading transistor of the first anti-fuse memory cell 1920. The gate structure 1906 can function as a gate terminal of the reading transistor of the first anti-fuse memory cell 1920. Similarly, a reading transistors of the second anti-fuse memory cell 1930 can be formed by the active region 1902 and the gate structure 1908, and a programming transistor of the second anti-fuse memory cell 1930 can be formed by the active region 1902 and the gate structure 1910. As such, the gate structures 1904 to 1910 can operatively serve as a first programming word line (e.g., $WLP_0$), a first reading word line (e.g., $WLR_0$), a second reading word line (e.g., $WLR_1$), and a second programming word line (e.g., $WLP_1$), respectively, as indicated in FIG. 19.

The layout 1900 further includes patterns 1932, 1934, and 1936 that are each configured to form a metal structure/track (hereinafter "metal track 1932," "metal track 1934," and "metal track 1936," respectively). In some embodiments, these metal tracks 1932 to 1936 are formed in one of a plural number of metallization layers disposed over the major surface of a substrate (e.g., along which the anti-fuse memory cells, e.g., 1920 and 1930, are formed). Such metallization layers are sometimes referred to as M0 layer, M1 layer, M2 layer, etc., where the M0 layer may be the closest one to the major surface of the substrate. Each of the metallization layers includes a number of metal tracks embedded in one or more corresponding inter-layer dielectric (ILD) materials or inter-metal dielectric (IMD) materials.

The metal tracks 1932 to 1936 may all be formed in M0 layer (and thus each hereinafter referred to as an M0 track). In some embodiments, the M0 track 1932 may operatively serve as a bit line (e.g., $BL_0$) connecting the first anti-fuse memory cell 1920 to the second anti-fuse memory cell 1930. The reading transistors of the first and second anti-fuse memory cells 1920 and 1930 share a common source/drain terminal coupled to the $BL_0$ through a via structure formed by a pattern 1938. The M0 track 1934 and M0 track 1936 can be coupled to the gate structure 1904 ($WLP_0$) and gate structure 1910 ($WLP_1$) through a via structure (formed by a pattern 1940) and a via structure (formed by a pattern 1942), respectively.

Figure 20:
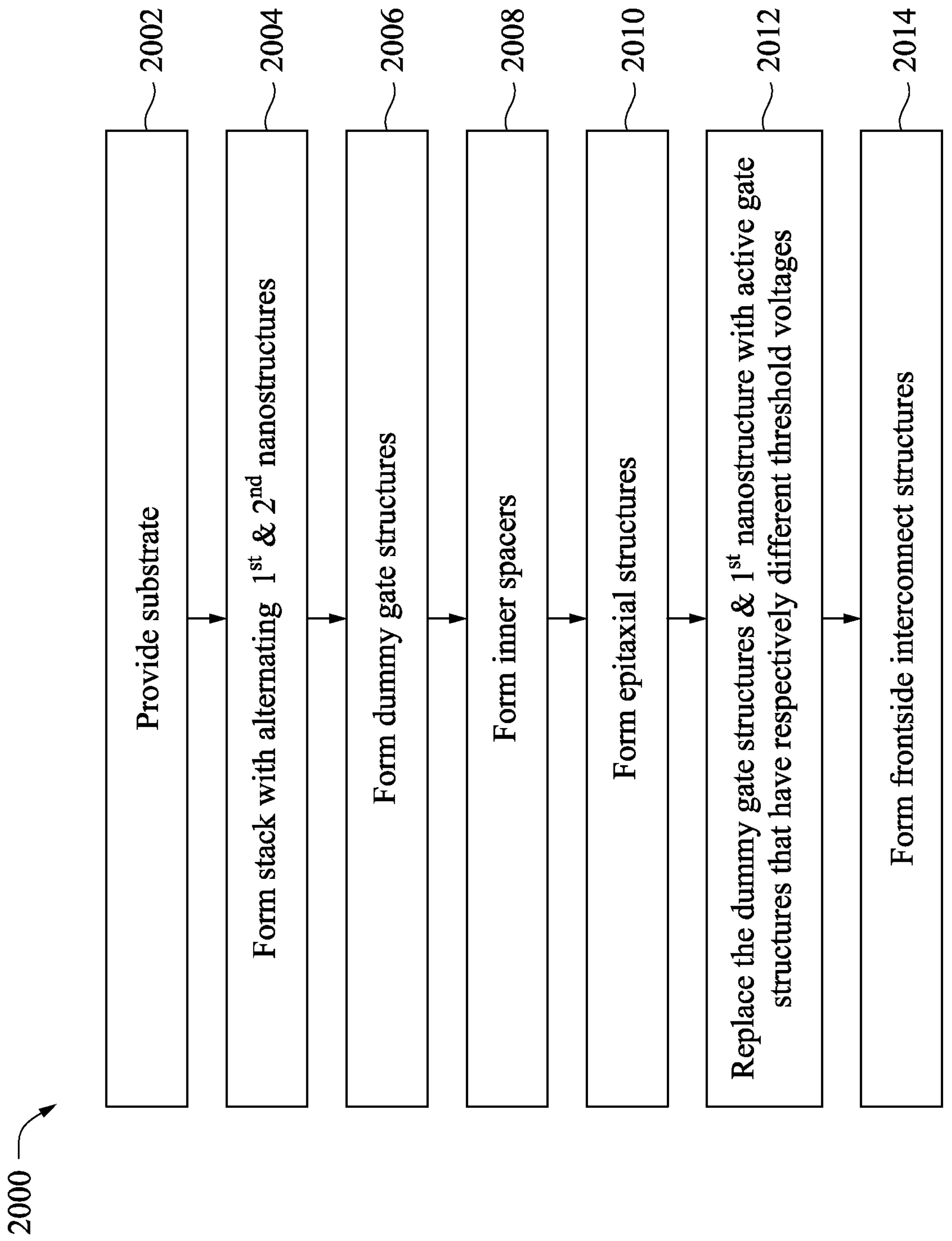
FIG. 20 illustrates a flow chart of an example method for fabricating a memory device including a virgin anti-fuse cell, a default 0 anti-fuse cell, and a default 1 anti-fuse cell, in accordance with some embodiments.

FIG. 20 illustrates a flow chart of an example method 2000 for forming a memory device including a memory array, in accordance with some embodiments. The memory array includes a number of virgin anti-fuse cells, a number of default 0 anti-fuse cells, a number of default 1 anti-fuse cells. In some embodiments, the method 2000 can be performed to form a memory device based on the layout 1900 shown in FIG. 19, and thus, some of the references of FIG. 19 may be reused in the following discussion of the method 2000. It is noted that the method 2000 is merely an example and is not intended to limit the present disclosure. Accordingly, it is understood that additional operations may be provided before, during, and after the method 2000 of FIG. 20, and that some other operations may only be briefly described herein.

The method 2000 starts with operation 2002 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 2000 continues to operation 2004 in which a stack, including an alternating series of first nanostructures and second nanostructures, is formed, in accordance with various embodiments. Such a stack can be formed based on one of the (active region) patterns discussed above. The stack can be formed in a frontside of the substrate. In some embodiments, the first nanostructures may include SiGe sacrificial nanostructures, and the second nanostructures may include Si channel nanostructures. Such a stack may sometimes be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 2000 continues to operation 2006 in which a number of dummy gate structures are formed, in accordance with various embodiments. Such a dummy gate structure can be formed based on one of the (gate structure) patterns discussed above. The dummy gate structure can extend along a direction perpendicular to the lengthwise direction of the dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

The method 2000 continues to operation 2008 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin structure), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 2000 continues to operation 2010 in which a number of epitaxial structures are formed, in accordance with various embodiments. Upon forming the inner spacers, the epitaxial structures are formed using an epitaxial layer growth process on exposed ends of the Si nanostructures. In situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 2000 continues to operation 2012 in which the dummy gate structures and the remaining SiGe sacrificial nanostructures are replaced with respective active gate structures, in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures are formed, respective programming and reading transistors of the disclosed anti-fuse memory cells, including the virgin anti-fuse cells, the default 0 anti-fuse cells, and the default 1 anti-fuse cells, can be formed.

In some embodiments, the active gate structures of the programming transistors of the virgin anti-fuse cell, the default 0 anti-fuse cell, and the default 1 anti-fuse cell may have respectively different compositions or otherwise configurations, causing their programming transistors to have a threshold voltage equal to, lower than, or higher than a threshold voltage of their corresponding reading transistors. Some of the non-limiting examples to implement the different threshold voltages include different thicknesses of the gate dielectric layers, different dielectric constants of the gate dielectric layer, different combinations of work function metal layers, etc.

The method 2000 proceeds to operation 2014 in which a number of frontside interconnect structures are formed, in accordance with various embodiments. Upon forming the programming and reading transistors, a number of middle-end interconnect structures (e.g., VGs, VDs, MDs) are formed over the programming and reading transistors. For example, a number of VGs can be formed to connect to gate terminals of the programming and reading transistors, respectively, and a number of MDs can be formed to connect to source/drain terminals of the programming and reading transistors, respectively. Further, a number of back-end metal tracks (e.g., M0 tracks, M1 tracks, M2 tracks, etc.) can be formed over the middle-end interconnect structures, which are operatively configured as the WLPs, WLRs, and BLs to couple to the respective programming and reading transistors.

The frontside interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The frontside interconnect structures can be formed by overlaying the frontside of the substrate with the above-listed metal material by, for example, chemical vapor deposition (CVD), physical vapor deposition (PVD), electroless plating, electroplating, or combinations thereof.

Figure 21:
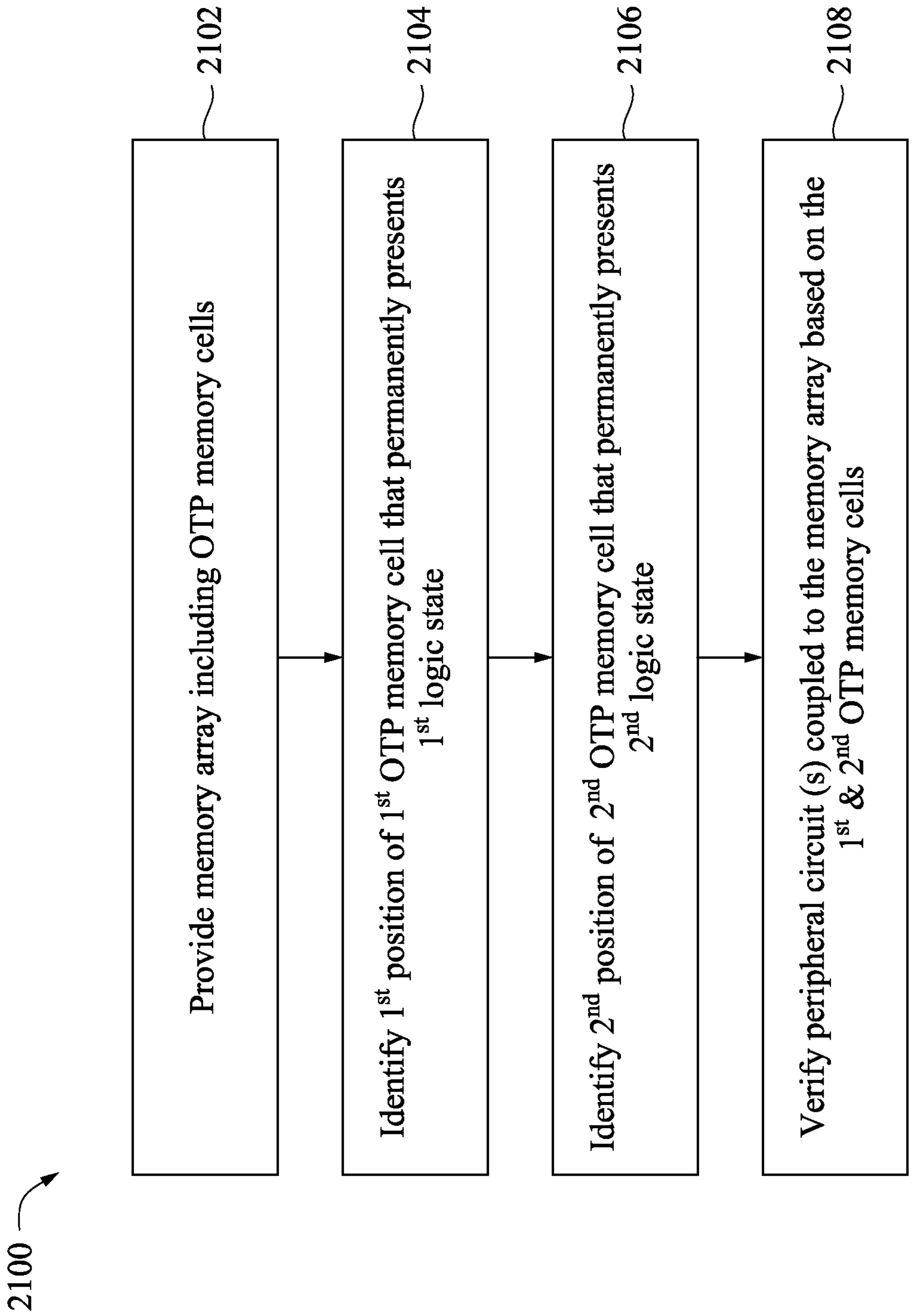
FIG. 21 illustrates a flow chart of an example method for verifying a memory device, in accordance with some embodiments.

FIG. 21 illustrates a flow chart of an example method 2100 for verifying a memory device, in accordance with some embodiments. Operations of the method 2100 may be performed to verify the memory device 100 of FIG. 1, which includes a memory array, e.g., 102, and a number of peripheral circuits, e.g., 104, 106, and 108. Further, the memory array 102 may include a number of default OTP memory cells with preconfigured logic states and positions, allowing the peripheral circuits to be verified. It is noted that the method 2100 is merely an example and is not intended to limit the present disclosure. Accordingly, it is understood that additional operations may be provided before, during, and after the method 2100 of FIG. 21, and that some other operations may only be briefly described herein.

The method 2100 starts with operation 2102 in which a memory array including a plurality of OTP memory cells is provided. Using the memory array 102 as a representative example, the memory array 102 includes a number of OTP memory cells 103. For example, the OTP memory cells 103 may be formed with a first logic state, and if programmable, the OTP memory cells 103 can be inversely programmed to a second, opposite logic state. In one aspect of the present disclosure, the OTP memory cells 103 are each implemented as an efuse memory cell, e.g., consisting of a fuse resistor and a WL transistor electrically connected to each other in series. In another aspect of the present disclosure, the OTP memory cells 103 are each implemented as an anti-fuse memory cell, e.g., consisting of at least a programming transistor and a reading transistor electrically connected to each other in series.

The method 2100 proceeds to operation 2104 in which a first position of a first one of the OTP memory cells in the memory array is identified. In some embodiments, the first OTP memory cell is configured to permanently present a first logic state based on a short circuit. The first position of the first OTP memory cell may be selected by a user of the memory device. Continuing with the above example, such a first OTP memory cell may be a default 0 efuse cell, e.g., $\mathbf{103}_{21}$ of FIG. 2, or a default 0 anti-fuse cell, e.g., $\mathbf{103}_{21}$ of FIG. 15. The default 0 efuse cell, by default, can present logic 0 through one or more short tracks as discussed above, and such logic 0 cannot be altered given that the default 0 efuse cell is formed to present logic 0. The default 0 anti-fuse cell, by default, can present logic 0 through a low-threshold-voltage programming transistor as discussed above, and such logic 0 cannot be altered given that the default 0 anti-fuse cell is formed to present logic 0.

The method 2100 proceeds to operation 2106 in which a second position of a second one of the OTP memory cells in the memory array is identified. In some embodiments, the second OTP memory cell is configured to permanently present a second logic state based on an open circuit. Similarly, the second position of the second OTP memory cell may be selected by the user of the memory device. Continuing with the above example, such a second OTP memory cell may be a default 1 efuse cell, e.g., $\mathbf{103}_{12}$ of FIG. 2, or a default 1 anti-fuse cell, e.g., $\mathbf{103}_{12}$ of FIG. 15. The default 1 efuse cell, by default, can present logic 1 through one or more open tracks as discussed above, and such logic 1 cannot be altered given that the default 1 efuse cell is formed to present logic 1. The default 1 anti-fuse cell, by default, can present logic 1 through a high-threshold-voltage programming transistor as discussed above, and such logic 1 cannot be altered given that the default 1 anti-fuse cell is formed to present logic 1.

The method 2100 proceeds to operation 2108 in which, based on at least one of the first logic state at the first position or the second logic state at the second position, a functionality of a peripheral circuit operatively coupled to the memory array is verified. In some embodiments, the first and second positions of the first and second OTP memory cells can be preconfigured. Further, respective numbers of the first and second OTP memory cells can also be preconfigured. Based on their positions in the memory array and respective default logic states, respective functionalities of the one or more peripheral circuits (e.g., sense amplifiers of the I/O circuit) operatively coupled to the memory array can be verified. For example, the logic state of a default cell and where such a default cell is located in an array can be preconfigured (e.g., known). If a sense amplifier operatively coupled to the default cell reads out a logic state inconsistent with the preconfigured logic state, the sense amplifier may be determined as malfunctioning. In another example, given that the logic state and the location of a default cell are both preconfigured and an operatively coupled sense amplifier has been determined as properly functioning, if the sense amplifier still reads out an inconsistent logic state. One or more other peripheral circuits (e.g., a corresponding column decoder and/or a corresponding row decoder) may be determined as malfunctioning.

In one aspect of the present disclosure, a memory device is disclosed. The memory device includes a memory array comprising a plurality of memory cells. At least a first one of the memory cells, by default, permanently presents a first logic state based on a short circuit. At least a second one of the memory cells, by default, permanently presents a second logic state opposite to the first logic state based on an open circuit.

In another aspect of the present disclosure, a memory device is disclosed. The memory device includes a memory array comprising a plurality of one-time-programmable (OTP) memory cells. A first subset of the OTP memory cells are configured to permanently present a first logic state based on a short circuit. A second subset of the OTP memory cells are configured to permanently present a second logic state opposite to the first logic state based on an open circuit.

In yet another aspect of the present disclosure, a method is disclosed. The method includes forming a plurality of transistors along a major surface of a substrate. The method includes forming a plurality of metal tracks over the plurality of transistors. A first one of the transistors, together with at least a first one of the plurality of metal tracks, collectively form a first memory cell, in which the first metal track forms a short circuit coupled to the first transistor. A second one of the transistors, together with at least a third one and a fourth one of the plurality of metal tracks collectively form a second memory cell, in which the third and fourth metal tracks form an open circuit coupled to the second transistor.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a memory array comprising a plurality of memory cells, wherein the memory cells each include an efuse memory cell;

wherein at least a first one of the memory cells, by default, permanently presents a first logic state based on a short circuit, wherein the first memory cell includes:

a transistor formed along a major surface of a substrate;

a first metal track disposed over the major surface and extending along a first lateral direction;

a second metal track disposed over the major surface, extending along the first lateral direction, and spaced apart from the first metal track along a second lateral direction perpendicular to the first lateral direction;

a third metal track disposed over the first and second metal tracks, and extending along the second lateral direction;

a fourth metal track disposed over the first and second metal tracks, and extending along the second lateral direction; and a fifth metal track disposed over the first and second metal tracks, extending along the second lateral direction, and interposed between the third and fourth metal tracks;

wherein the third and the fourth metal tracks each electrically couple the first metal track to the second metal track so as to form the short circuit;

wherein the fifth metal track is electrically isolated from each of the first metal track and second metal track; and wherein at least a second one of the memory cells, by default, permanently presents a second logic state opposite to the first logic state based on an open circuit.

2. The memory device of claim 1, wherein the third and fourth metal tracks each have a first width along the first lateral direction and the fifth metal track has a second width along the first lateral direction, and wherein the first width is substantially greater than the second width.

3. The memory device of claim 1, wherein the second memory cell includes a transistor formed along a major surface of a substrate.

4. The memory device of claim 3, wherein the second memory cell further includes:

a sixth metal track disposed over the major surface and extending along the first lateral direction;

a seventh metal track disposed over the major surface, extending along the first lateral direction, and spaced apart from the sixth metal track along a second lateral direction perpendicular to the first lateral direction;

an eighth metal track disposed over the sixth metal track, and extending along the second lateral direction;

a ninth metal track disposed over the seventh metal track, and extending along the second lateral direction;

a tenth metal track disposed over the sixth metal track, extending along the second lateral direction, and spaced apart from the eighth metal track along the first lateral direction;

an eleventh metal track disposed over the seventh metal track, extending along the second lateral direction, and spaced apart from the ninth metal track along the first lateral direction; and a twelfth metal track disposed over the sixth and seventh metal tracks, extending along the second lateral direction, and interposed between the eighth and tenth metal tracks and between the ninth and eleventh metal tracks;

wherein the eighth and tenth metal tracks are each electrically coupled to the sixth metal track and the ninth and eleventh metal tracks are each electrically coupled to the seventh metal track, but the eighth metal track is electrically isolated from the ninth metal track and the tenth metal track is electrically isolated from the eleventh metal track so as to form the open circuit; and wherein the twelfth metal track is electrically isolated from each of the sixth metal track and seventh metal track.

5. The memory device of claim 4, wherein the eighth to eleventh metal tracks each have a third width along the first lateral direction and the twelfth metal track has a fourth width along the first lateral direction, and wherein the third width is substantially greater than the fourth width.

6. The memory device of claim 1, wherein respective positions of the first memory cell and second memory cell in the memory array are preconfigured.

7. The memory device of claim 1, wherein the first memory cell presents the first logic state as fabricated and without any programming process, and the second memory cell presents the second logic state as fabricated and without any programming process.

8. A memory device, comprising:

a memory array comprising a plurality of memory cells, wherein the memory cells each include an anti-fuse memory cell;

wherein at least a first one of the memory cells, by default, permanently presents a first logic state based on a short circuit, wherein the first memory cell includes a reading transistor and a programming transistor connected to each other in series, wherein the reading transistor has a first threshold voltage and the programming transistor has a second threshold voltage, and wherein the second threshold voltage is substantially lower than the first threshold voltage so as to form the short circuit; and wherein at least a second one of the memory cells, by default, permanently presents a second logic state opposite to the first logic state based on an open circuit.

9. The memory device of claim 8, wherein the second memory cell includes a reading transistor and a programming transistor connected to each other in series, wherein the reading transistor has a first threshold voltage and the programming transistor has a second threshold voltage, and wherein the second threshold voltage is substantially higher than the first threshold voltage so as to form the open circuit.

10. The memory device of claim 8, wherein the first memory cell presents the first logic state as fabricated and without any programming process, and the second memory cell presents the second logic state as fabricated and without any programming process.

11. The memory device of claim 8, wherein respective positions of the first memory cell and second memory cell in the memory array are preconfigured.

12. The memory device of claim 8, wherein a gate dielectric layer of the programming transistor is thinner than a gate dielectric layer of the reading transistor.

13. A memory device, comprising:

a memory array comprising a plurality of memory cells;

wherein a first one of the memory cells comprises:

a first transistor formed along a major surface of a substrate;

a first metal track disposed over the major surface and extending along a first lateral direction;

a second metal track disposed over the major surface, extending along the first lateral direction, and spaced apart from the first metal track along a second lateral direction perpendicular to the first lateral direction;

a third metal track disposed over the first and second metal tracks, and extending along the second lateral direction;

a fourth metal track disposed over the first and second metal tracks, and extending along the second lateral direction; and a fifth metal track disposed over the first and second metal tracks, extending along the second lateral direction, and interposed between the third and fourth metal tracks;

wherein the third and the fourth metal tracks each electrically couple the first metal track to the second metal track, so as to form a short circuit;

wherein a second one of the memory cells comprises:

a sixth metal track disposed over the major surface and extending along the first lateral direction;

a seventh metal track disposed over the major surface, extending along the first lateral direction, and spaced apart from the sixth metal track along the second lateral direction;

an eighth metal track disposed over the sixth metal track, and extending along the second lateral direction;

a ninth metal track disposed over the seventh metal track, and extending along the second lateral direction;

a tenth metal track disposed over the sixth metal track, extending along the second lateral direction, and spaced apart from the eighth metal track along the first lateral direction;

an eleventh metal track disposed over the seventh metal track, extending along the second lateral direction, and spaced apart from the ninth metal track along the first lateral direction; and a twelfth metal track disposed over the sixth and seventh metal tracks, extending along the second lateral direction, and interposed between the eighth and tenth metal tracks and between the ninth and eleventh metal tracks;

wherein the eighth and tenth metal tracks are each electrically coupled to the sixth metal track and the ninth and eleventh metal tracks are each electrically coupled to the seventh metal track, but the eighth metal track is electrically isolated from the ninth metal track and the tenth metal track is electrically isolated from the eleventh metal track so as to form an open circuit.

14. The memory device of claim 13, wherein the fifth metal track is electrically isolated from each of the first metal track and second metal track.

15. The memory device of claim 13, wherein the twelfth metal track is electrically isolated from each of the sixth metal track and seventh metal track.

16. The memory device of claim 13, wherein the first memory cell, by default, permanently presents a first logic state based on the short circuit.

17. The memory device of claim 16, wherein the second memory cell, by default, permanently presents a second logic state opposite to the first logic state based on the open circuit.

18. The memory device of claim 13, wherein the memory cells each include an efuse memory cell.

19. The memory device of claim 13, wherein respective positions of the first memory cell and second memory cell in the memory array are preconfigured.

20. The memory device of claim 17, wherein the first memory cell presents the first logic state as fabricated and without any programming process, and the second memory cell presents the second logic state as fabricated and without any programming process.

* * * * *